United States Patent
Lee et al.

(10) Patent No.: US 11,997,933 B2
(45) Date of Patent: May 28, 2024

(54) PHASE-CHANGE MEMORY DEVICE AND METHOD

(71) Applicant: Taiwan Semiconductor Manufacturing Co., Ltd., Hsinchu (TW)

(72) Inventors: Tung Ying Lee, Hsinchu (TW); Shao-Ming Yu, Zhubei (TW); Yu Chao Lin, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 67 days.

(21) Appl. No.: 17/867,460

(22) Filed: Jul. 18, 2022

(65) Prior Publication Data

US 2022/0352465 A1    Nov. 3, 2022

Related U.S. Application Data

(62) Division of application No. 17/072,897, filed on Oct. 16, 2020, now Pat. No. 11,411,181.

(60) Provisional application No. 63/001,944, filed on Mar. 30, 2020.

(51) Int. Cl.
*H10N 70/00* (2023.01)
*H10B 63/00* (2023.01)
*H10N 70/20* (2023.01)

(52) U.S. Cl.
CPC ........... *H10N 70/068* (2023.02); *H10B 63/24* (2023.02); *H10B 63/80* (2023.02); *H10N 70/063* (2023.02); *H10N 70/231* (2023.02); *H10N 70/826* (2023.02)

(58) Field of Classification Search
CPC .................................................. H10L 45/1691
See application file for complete search history.

(56) References Cited

U.S. PATENT DOCUMENTS

| | | |
|---|---|---|
| 7,122,386 B1 | 10/2006 | Torng et al. |
| 9,412,752 B1 | 8/2016 | Yeh et al. |
| 9,590,012 B2 | 3/2017 | Lee et al. |
| 11,257,864 B2 | 2/2022 | Wang et al. |
| 2002/0038876 A1 | 4/2002 | Aratani |
| 2005/0174861 A1 | 8/2005 | Kim et al. |

(Continued)

FOREIGN PATENT DOCUMENTS

| | | |
|---|---|---|
| KR | 20050071965 A | 7/2005 |
| KR | 20110005157 A | 1/2011 |

(Continued)

*Primary Examiner* — Mounir S Amer
(74) *Attorney, Agent, or Firm* — Slater Matsil, LLP

(57) ABSTRACT

In an embodiment, a device includes: a first metallization layer over a substrate, the substrate including active devices; a first bit line over the first metallization layer, the first bit line connected to first interconnects of the first metallization layer, the first bit line extending in a first direction, the first direction parallel to gates of the active devices; a first phase-change random access memory (PCRAM) cell over the first bit line; a word line over the first PCRAM cell, the word line extending in a second direction, the second direction perpendicular to the gates of the active devices; and a second metallization layer over the word line, the word line connected to second interconnects of the second metallization layer.

20 Claims, 30 Drawing Sheets

(56) References Cited

U.S. PATENT DOCUMENTS

| | | |
|---|---|---|
| 2006/0202245 A1 | 9/2006 | Zuliani et al. |
| 2009/0121208 A1 | 5/2009 | Nagashima et al. |
| 2010/0084624 A1 | 4/2010 | Lung et al. |
| 2010/0259960 A1 | 10/2010 | Samachisa |
| 2011/0233505 A1 | 9/2011 | Nitta |
| 2011/0297911 A1 | 12/2011 | Shima et al. |
| 2012/0195100 A1 | 8/2012 | Saitoh et al. |
| 2014/0091274 A1 | 4/2014 | Kim et al. |
| 2014/0220763 A1 | 8/2014 | Liu et al. |
| 2014/0239376 A1 | 8/2014 | Zhang et al. |
| 2014/0241027 A1 | 8/2014 | Hung et al. |
| 2015/0084140 A1 | 3/2015 | Satoh et al. |
| 2015/0194602 A1 | 7/2015 | Liao et al. |
| 2017/0117467 A1 | 4/2017 | Chang et al. |
| 2017/0221813 A1 | 8/2017 | Kim |
| 2020/0066985 A1* | 2/2020 | Park .................... H10N 70/231 |
| 2020/0411755 A1 | 12/2020 | Lin et al. |
| 2021/0083181 A1 | 3/2021 | Chen et al. |
| 2021/0336138 A1 | 10/2021 | Lee et al. |

FOREIGN PATENT DOCUMENTS

| | | |
|---|---|---|
| KR | 20120088594 A | 8/2012 |
| KR | 20140042986 A | 4/2014 |
| KR | 20170049337 A | 5/2017 |
| KR | 20170090183 A | 8/2017 |
| TW | 201015763 A | 4/2010 |
| WO | 2008155832 A1 | 12/2008 |

\* cited by examiner

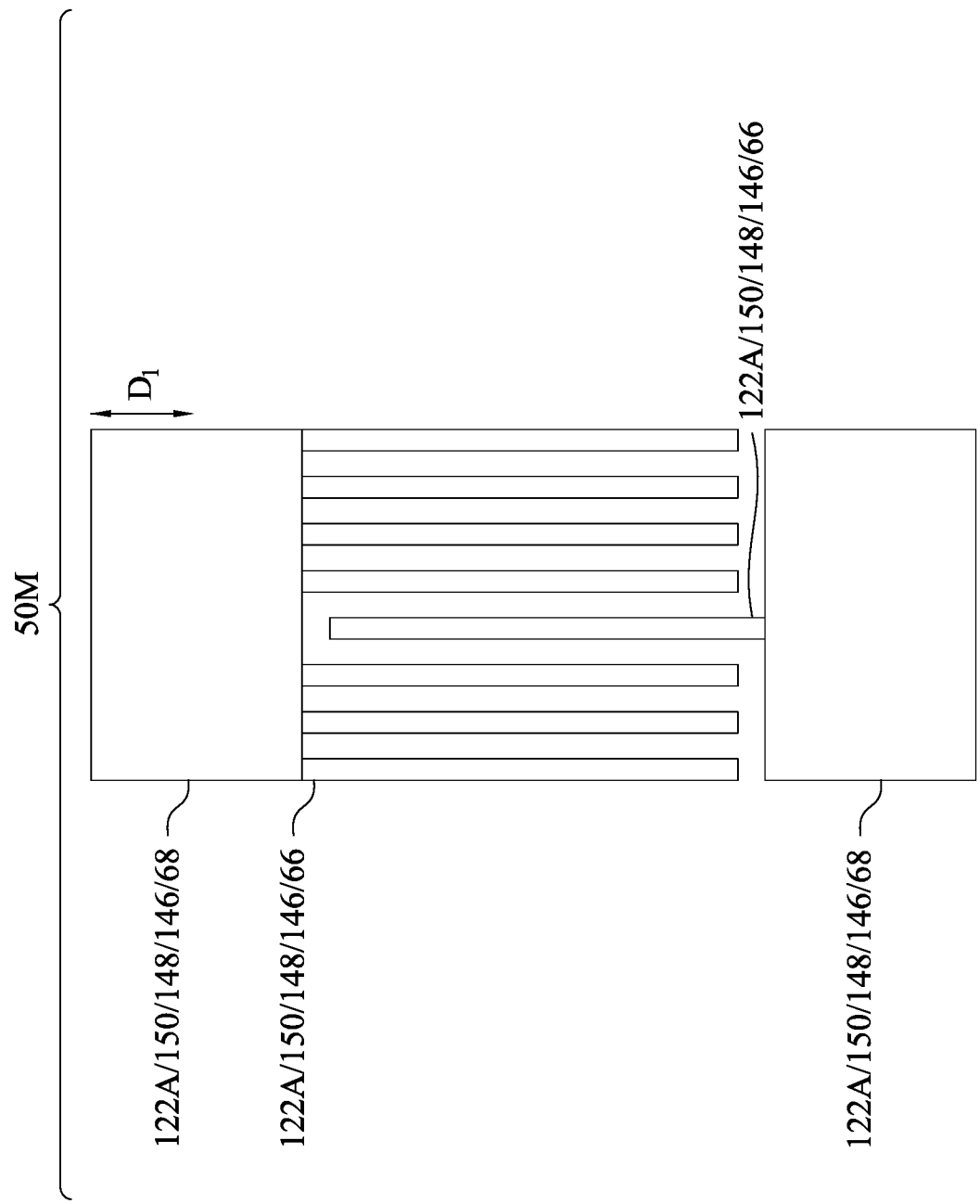

PHASE-CHANGE MEMORY DEVICE AND METHOD

PRIORITY CLAIM AND CROSS-REFERENCE

This application is a division of U.S. patent application Ser. No. 17/072,897, filed on Oct. 16, 2020, entitled "Phase-Change Memory Device and Method," which claims the benefit of U.S. Provisional Application No. 63/001,944, filed on Mar. 30, 2020, which applications are hereby incorporated herein by reference.

BACKGROUND

Semiconductor memories are used in integrated circuits for electronic applications, including radios, televisions, cell phones, and personal computing devices, as examples. One type of semiconductor memory is phase-change random access memory (PCRAM), which involves storing values in phase change materials, such as chalcogenide materials. Phase change materials can be switched between an amorphous phase (in which they have a low resistivity) and a crystalline phase (in which they have a high resistivity) to indicate bit codes. A PCRAM cell typically includes a phase change material (PCM) element between two electrodes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
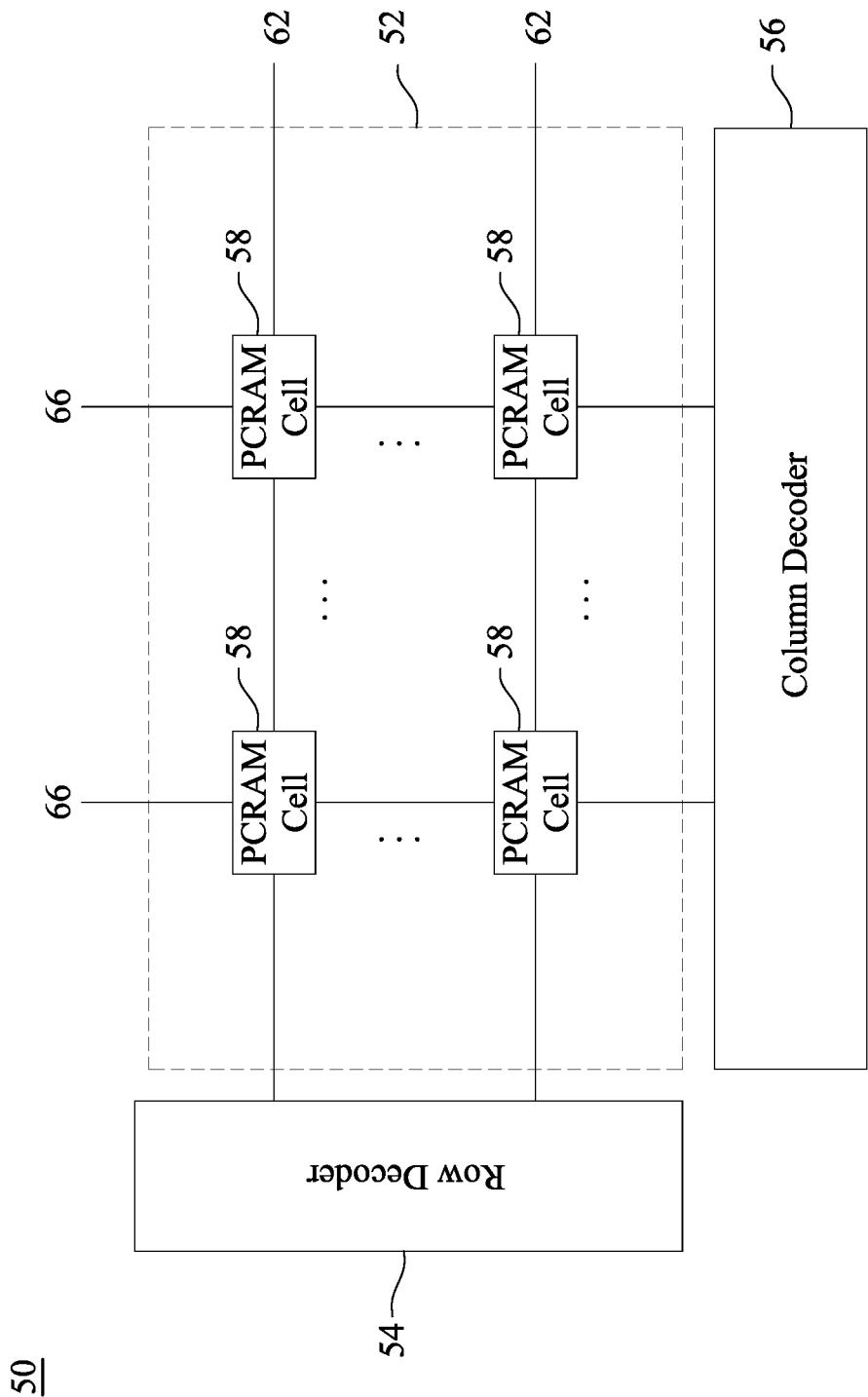
FIG. 1 is a block diagram of a semiconductor device, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, PCRAM cells are formed in a self-aligned manner with multiple patterning processes. The PCRAM cells can thus be formed at a smaller pitch and with smaller critical dimensions. The performance and density of the PCRAM cells may thus be improved.

FIG. 1 is a block diagram of a semiconductor device 50, in accordance with some embodiments. The semiconductor device 50 includes a PCRAM array 52, a row decoder 54, and a column decoder 56. The PCRAM array 52 includes PCRAM cells 58 arranged in rows and columns. The row decoder 54 may be, e.g., a static CMOS decoder, a pseudo-NMOS decoder, or the like. During operation, the row decoder 54 selects desired PCRAM cells 58 in a row of the PCRAM array 52 by activating the respective word line 62 for the row. The column decoder 56 may be, e.g., a static CMOS decoder, a pseudo-NMOS decoder, or the like, and may include writer drivers, sense amplifiers, combinations thereof, or the like. During operation, the column decoder 56 selects bit lines 66 for the desired PCRAM cells 58 from columns of the PCRAM array 52 in the selected row, and reads data from or writes data to the selected PCRAM cells 58 with the bit lines 66.

Although embodiments herein are described in the context of PCRAMs, it should be appreciated that similar techniques could be applied in other memories that use programmable resistance elements. For example, similar techniques could be used to manufacture magnetoresistive random-access memories (MRAMs), resistive random access memories (RRAMs), memories with a selector structure, and the like.

Figure 2:
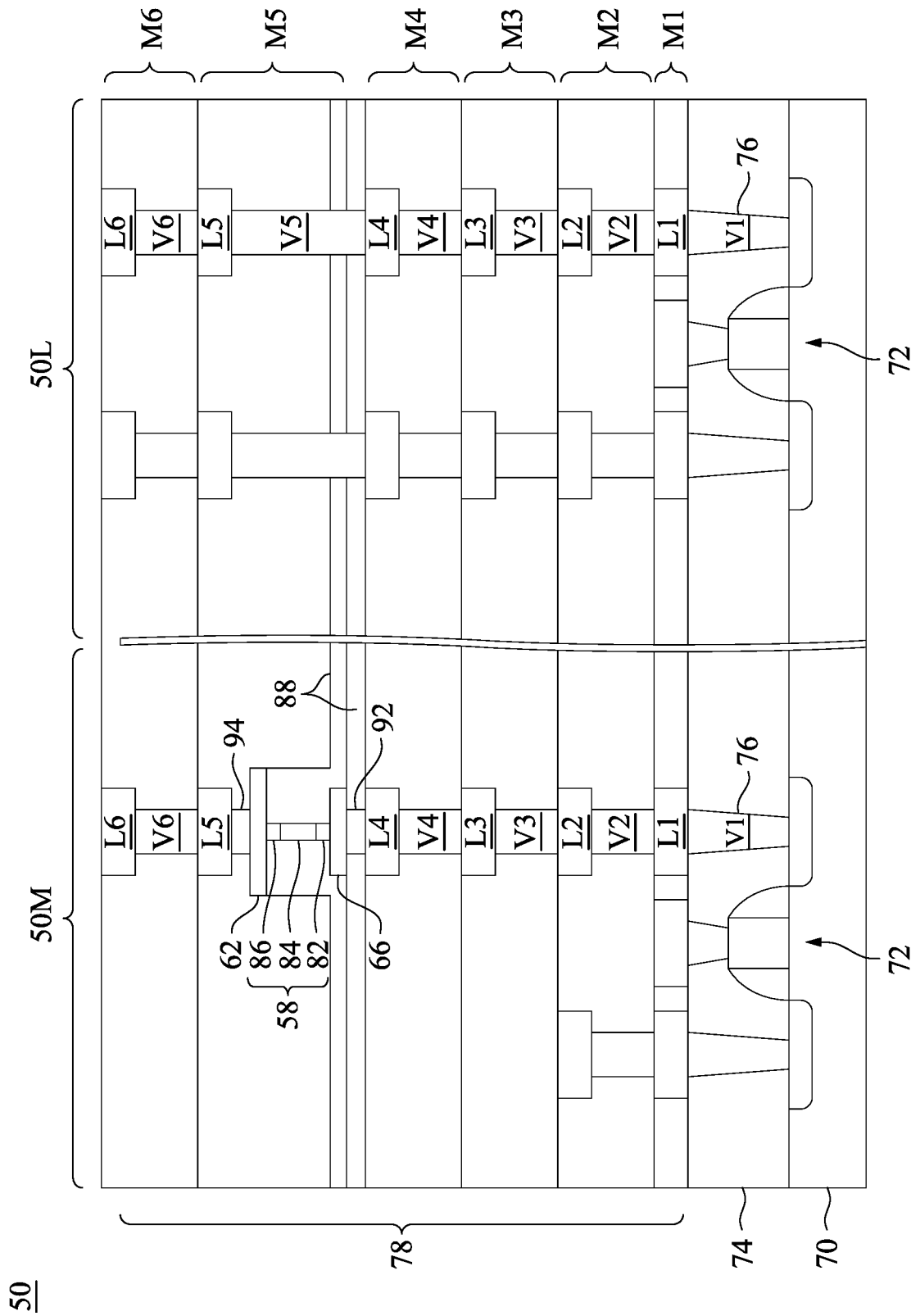
FIG. 2 is a cross-sectional view of a semiconductor device, in accordance with some embodiments.

FIG. 2 is a cross-sectional view of the semiconductor device 50, in accordance with some embodiments. FIG. 2 is a simplified view, and some features of the semiconductor device 50 (discussed below) are omitted for clarity of illustration. The semiconductor device 50 includes a logic region 50L and a memory region 50M. Memory devices (e.g., PCRAMs) are formed in the memory region 50M and logic devices (e.g., logic circuits) are formed in the logic region 50L. For example, the PCRAM array 52 (see FIG. 1) can be formed in the memory region 50M, and the row decoder 54 and the column decoder 56 (see FIG. 1) can be formed in the logic region 50L. The logic region 50L may occupy most of the area of the semiconductor device 50. For example, the logic region 50L may occupy from 95% to 99% of the area of the semiconductor device 50, with the memory region 50M occupying the remaining area of the semiconductor device 50. The memory region 50M can be disposed at an edge of the logic region 50L, or the logic region 50L can surround the memory region 50M.

The logic region 50L and memory region 50M are formed over a same substrate, e.g., a semiconductor substrate 70. The semiconductor substrate 70 may be silicon, doped or undoped, or an active layer of a semiconductor-on-insulator (SOI) substrate. The semiconductor substrate 70 may include other semiconductor materials, such as germanium; a compound semiconductor including silicon carbide, gallium arsenic, gallium phosphide, gallium nitride, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multilayered or gradient substrates, may also be used.

Devices 72 are formed at the active surface of the semiconductor substrate 70 (e.g., the surface facing upwards in FIG. 2). The devices 72 may be active devices or passive devices. For example, the electrical components may be transistors, diodes, capacitors, resistors, or the like, formed by any suitable formation method. The devices 72 are interconnected to form the memory devices and logic devices of the semiconductor device 50. For example, some of the devices 72 may be access transistors for the PCRAM cells 58.

One or more inter-layer dielectric (ILD) layer(s) 74 are formed on the semiconductor substrate 70, and electrically conductive features, such as contact plugs 76, are formed physically and electrically coupled to the devices 72. The ILD layer(s) 74 may be formed of any suitable dielectric material, for example, an oxide such as silicon oxide, phosphosilicate glass (PSG), borosilicate glass (BSG), boron-doped phosphosilicate glass (BPSG), or the like; a nitride such as silicon nitride; or the like. The ILD layer(s) may be formed by any suitable deposition process, such as spin coating, physical vapor deposition (PVD), chemical vapor deposition (CVD), the like, or a combination thereof. The electrically conductive features in the ILD layer(s) may be formed through any suitable process, such as deposition, damascene (e.g., single damascene, dual damascene, etc.), the like, or combinations thereof.

An interconnect structure 78 is formed over the semiconductor substrate 70, e.g., over the ILD layer(s) 74. The interconnect structure 78 interconnects the devices 72 to form integrated circuits in each of the logic region 50L and memory region 50M. The interconnect structure 78 includes multiple metallization layers M1-M6. Although six metallization layers are illustrated, it should be appreciated that more or less metallization layers may be included. Each of the metallization layers M1-M6 includes metallization patterns in dielectric layers. The metallization patterns are electrically coupled to the devices 72 of the semiconductor substrate 70, and include, respectively, metal lines L1-L6 and vias V1-V6 formed in one or more inter-metal dielectric (IMD) layers. The interconnect structure 78 may formed by a damascene process, such as a single damascene process, a dual damascene process, or the like. In some embodiments, the contact plugs 76 are also part of the metallization patterns, such as part of the lowest layer of metal vias V1.

The PCRAM cells 58 of the PCRAM array 52 (see FIG. 1) are formed in the interconnect structure 78. The PCRAM cells 58 can be formed in any of the metallization layers M1-M6, and are illustrated as being formed in an intermediate metallization layer M5. Each PCRAM cell 58 includes a bottom electrode 82, a PCM element 84 on the bottom electrode 82, and a top electrode 86 on the PCM element 84. Word lines 62 extend along respective rows of the PCRAM cells 58 and are connected to the top electrodes 86 of the respective rows of the PCRAM cells 58. Bit lines 66 extend along respective columns of the PCRAM cells 58 and are connected to the bottom electrodes 82 of the respective columns of the PCRAM cells 58. One or more additional IMD layer(s) 88 can be formed around the PCRAM cells 58. The IMD layer(s) 88 surround and protect the components of the PCRAM cells 58. The resistance of a PCM element 84 is programmable, and can be changed between a high resistance ($R_{AP}$), which can signify a code such as a "1," and a low resistance ($R_P$), which can signify a code such as a "0." As such, a code can be written to a PCRAM cell 58 by programming the resistance of its PCM element 84 with its corresponding access transistor, and a code can be read from a PCRAM cell 58 by measuring the resistance of its PCM element 84 with its corresponding access transistor.

The PCRAM cells 58 are electrically coupled to the devices 72. The bit lines 66 are connected to conductive features (e.g., interconnects) of an underlying metallization pattern, such as to the metallization layer M4 in the illustrated example, by conductive vias 92. The word lines 62 are connected to conductive features (e.g., interconnects) of an overlying metallization pattern, such as to the metallization layer M6 in the illustrated example, by conductive vias 94. A first subset of the devices 72 (e.g., access transistors), such as devices of the row decoder 54, are electrically coupled to the word lines 62. The bit lines 66 are electrically coupled to a second subset of the devices 72, such as devices of the column decoder 56.

Figure 21A:
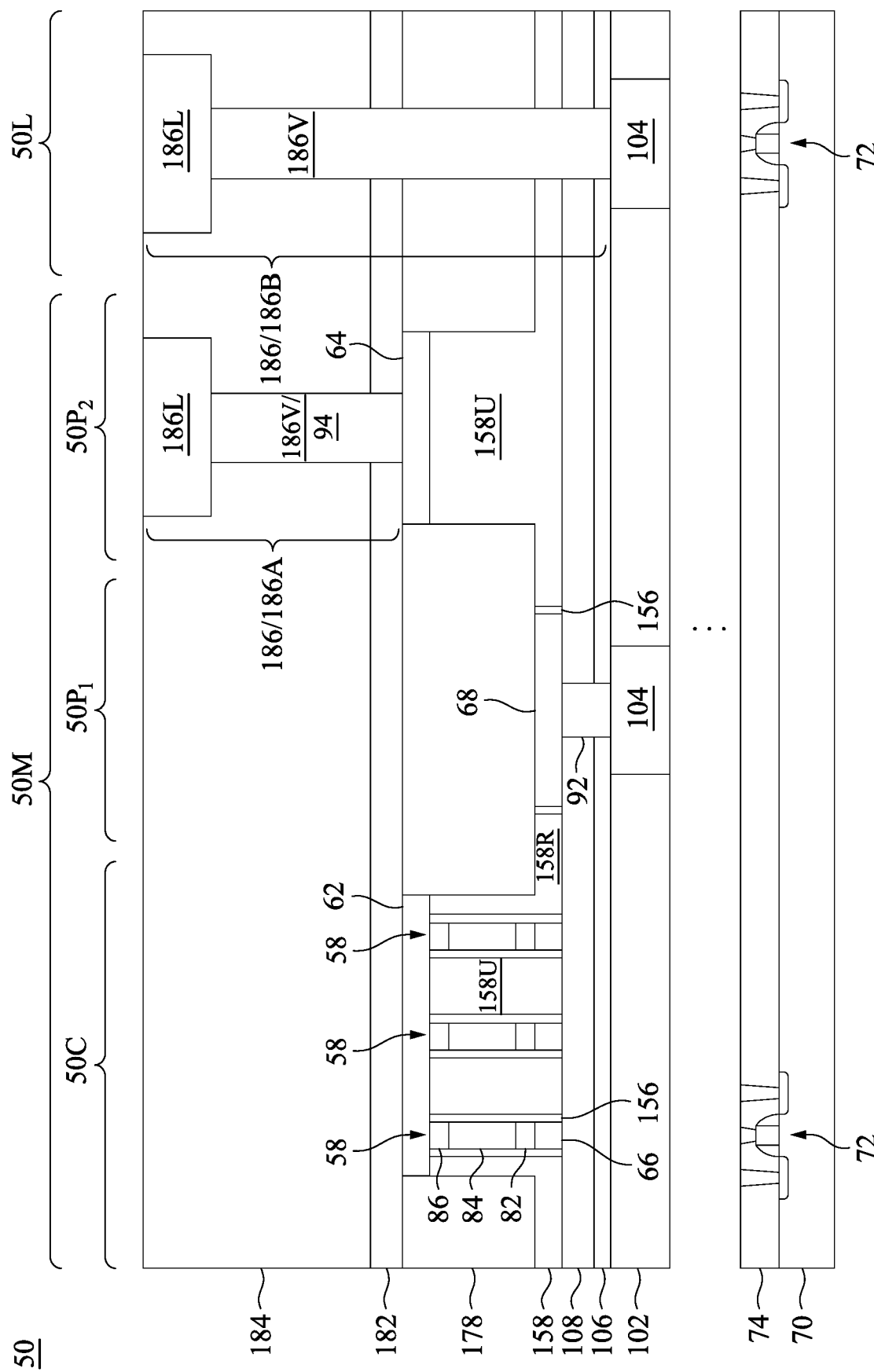
Figure 21B:
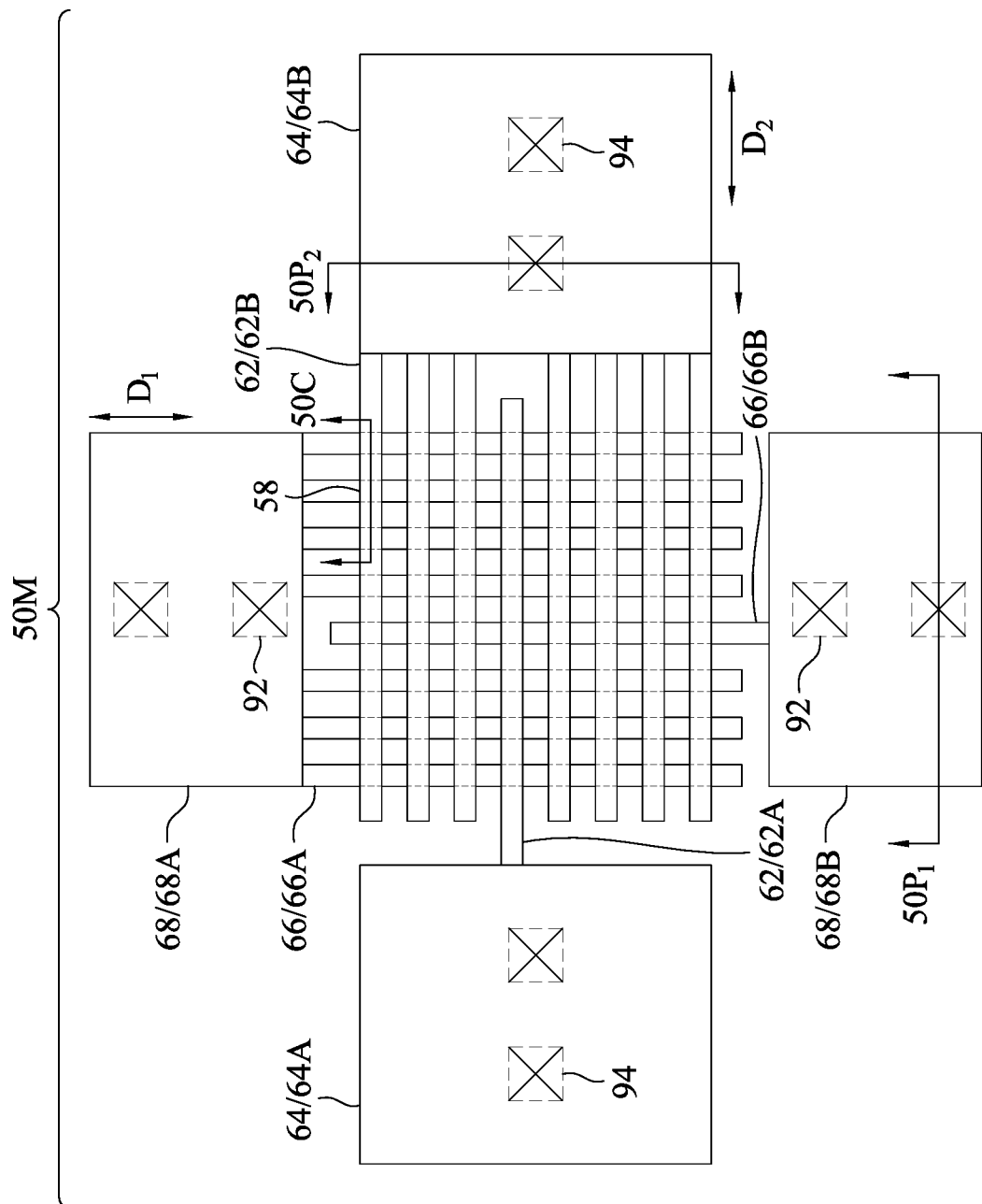

Referring initially to FIG. 21B, a simplified top-down view of a portion of the memory region 50M is shown. Some features of the semiconductor device 50 (discussed in greater detail below) are omitted for clarity of illustration. A portion of a PCRAM array is shown. As will be described in greater detail below, the PCRAM cells 58 are formed in a checkerboard layout. Such an array of PCRAM cells 58 is formed in a self-aligned manner by etching a stack of conductive and phase change material (PCM) layers twice: first using a pattern of the bit lines 66, and again using a pattern of the word lines 62. The etching processes form the word lines 62, the bit lines 66, and the PCRAM cells 58, with each PCRAM cell 58 being disposed at an intersection of a word line 62 and a bit line 66 in the top-down view.

The bit lines 66 extend along a first direction $D_1$, which is parallel to the active surface of the semiconductor substrate 70 (see FIG. 2) and parallel to the longitudinal axes of the gates of the devices 72 (e.g., transistors). The bit lines 66 each emanate from a bit line pad 68. Each bit line pad 68 is coupled to at least one bit line 66. Although illustrated as separate elements, as will be described in greater detail below, each bit line pad 68 and its corresponding bit lines 66 are actually a single continuous conductive feature. The bit line pads 68 are connected to conductive features (e.g., interconnects) of an underlying metallization pattern (such as to the metallization layer M4 in the example of FIG. 2) by the conductive vias 92. As will be described in greater detail below, the conductive vias 92 are electrically coupled to the bottom electrodes 82 of the PCRAM cells 58 (see FIG. 2). As such, each conductive via 92 can also be referred to as a bottom electrode via (BEVA).

The word lines 62 extend along a second direction $D_2$, which is parallel to the active surface of the semiconductor substrate 70 (see FIG. 2) and is perpendicular to the first direction $D_1$ (e.g., perpendicular to the longitudinal axes of the gates of the devices 72 (e.g., transistors)). The word lines 62 each emanate from a word line pad 64. Each word line pad 64 is coupled to at least one word line 62. Although illustrated as separate elements, as will be described in greater detail below, each word line pad 64 and its corresponding word lines 62 are actually a single continuous conductive feature. The word line pads 64 are connected to conductive features (e.g., interconnects) of an overlying metallization pattern (such as to the metallization layer M6 in the example of FIG. 2) by the conductive vias 94. As will be described in greater detail below, the conductive vias 94 are electrically coupled to the top electrodes 86 of the PCRAM cells 58 (see FIG. 2). As such, each conductive via 94 can also be referred to as a top electrode via (TEVA).

FIG. 21B further illustrates several reference cross-sections. Cross-section 50C is across several PCRAM cells 58. Cross-section 50P₁ is parallel to cross-section 50C, and is across a bit line pad 68. Cross-section 50P₂ is perpendicular to cross-section 50C, and is across a word line pad 64. Subsequent figures refer to these cross-sections for clarity.

FIGS. 3 through 21B are various views of intermediate stages in the manufacturing of the semiconductor device 50, in accordance with some embodiments. Specifically, the manufacturing of the interconnect structure 78 (see FIG. 2) for the semiconductor device 50 is shown. As noted above, the interconnect structure 78 includes the PCRAM cells 58 of the PCRAM array 52 (see FIG. 1).

FIGS. 3, 4, 5, 6, 7, 8, 9, 10, 11A, 12A, 13, 14, 15, 16, 17A, 18A, 19, 20, and 21A are cross-sectional view illustrating the logic region 50L and the memory region 50M, including a cell region 50C (which illustrates cross-section 50C in FIG. 21B), a first pad region 50P₁ (which illustrates cross-section 50P₁ in FIG. 21B), and a second pad region 50P₂ (which illustrates cross-section 50P₂ in FIG. 21B). As will be described in greater detail below, a bit line pad 68 (see FIG. 12A) will be formed in the first pad region 50P₁, a word line pad 64 (see FIG. 18A) will be formed in the second pad region 50P₂, and the PCRAM cells 58 (see FIG. 18A) will be formed in the cell region 50C. Although the first pad region 50P₁, the second pad region 50P₂, and the cell region 50C are each illustrated in the same cross-sectional view, it should be appreciated that each of the regions are in different cross-sections, as shown by FIG. 21B.

FIGS. 11B, 12B, 17B, 18B, and 21B are top-down views illustrating the memory region 50M. FIGS. 11B, 12B, 17B, 18B, and 21B show the semiconductor device 50 at a similar step of processing as FIGS. 11A, 12A, 17A, 18A, and 21A, respectively. FIGS. 11B, 12B, 17B, 18B, and 21B are simplified views, and some features are omitted for clarity of illustration.

Figure 3:
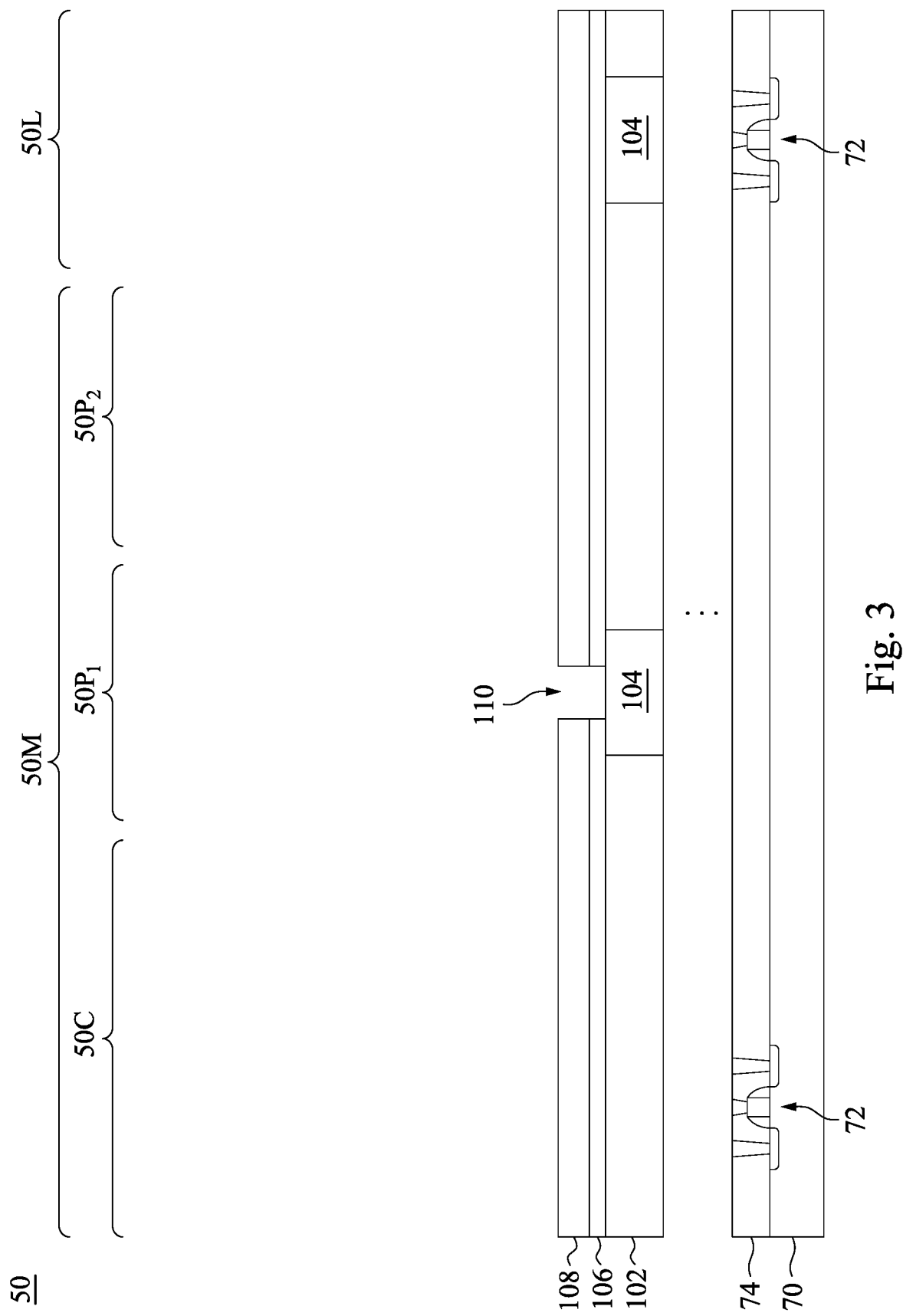
FIGS. 3 through 21B are various views of intermediate stages in the manufacturing of a semiconductor device, in accordance with some embodiments.

In FIG. 3, a metallization layer (e.g., M4, see FIG. 2) of the interconnect structure is formed. The metallization layer includes an IMD layer 102 and conductive features 104 (which can correspond to the metal lines L4, see FIG. 2). The IMD layer 102 is formed over the ILD layer(s) 74. The IMD layer 102 may be formed of any suitable dielectric material, for example, an oxide such as silicon oxide, phosphosilicate glass (PSG), borosilicate glass (BSG), boron-doped phosphosilicate glass (BPSG), or the like; a nitride such as silicon nitride; or the like. The IMD layer 102 may be formed by any suitable deposition process, such as spin coating, PVD, chemical vapor deposition (CVD), the like, or a combination thereof. The IMD layer 102 may be a layer formed of a low-k dielectric material having a k-value lower than about 3.0. The IMD layer 102 may be a layer formed of an extra-low-k (ELK) dielectric material having a k-value of less than 2.5.

Conductive features 104 are formed in the IMD layer 102, and are electrically coupled to the devices 72. In accordance with some embodiments, the conductive features 104 include diffusion barrier layers and conductive material over the diffusion barrier layers. Openings are formed in the IMD layer 102 using, e.g., an etching process. The openings expose underlying conductive features, such as underlying metal vias. The diffusion barrier layers may be formed of tantalum nitride, tantalum, titanium nitride, titanium, cobalt-tungsten, or the like, and may be formed in the openings by a deposition process such as atomic layer deposition (ALD) or the like. The conductive material may include copper, aluminum, tungsten, silver, and combinations thereof, or the like, and may be formed over the diffusion barrier layers in the openings by an electro-chemical plating process, CVD, ALD, PVD, the like, or a combination thereof. In an embodiment, the conductive material is copper, and the diffusion barrier layers are thin barrier layers that prevent the copper from diffusing into the IMD layer 102. After formation of the diffusion barrier layers and the conductive material, excess of the diffusion barrier layers and conductive material may be removed by, for example, a planarization process such as a chemical mechanical polish (CMP) process. In some embodiments, the conductive features 104 are metal lines (which can correspond to the metal lines L4, see FIG. 2).

An etch stop layer 106 is formed on the conductive features 104 and the IMD layer 102. The etch stop layer 106 may be formed of a dielectric material such as aluminum nitride, aluminum oxide, silicon oxide, silicon nitride, silicon oxynitride, silicon carbide, a combination thereof, or the like. The etch stop layer 106 may be formed by chemical vapor deposition (CVD), PVD, ALD, a spin-on-dielectric process, the like, or a combination thereof. The etch stop layer 106 may also be a composite layer formed of a plurality of different dielectric sublayers. For example, the etch stop layer 106 may include a silicon carbide sublayer and an aluminum oxide sublayer formed on the silicon carbide sublayer. The silicon carbide sublayer can be used as a glue layer to improve adhesion between the aluminum oxide sublayer and the IMD layer 102.

An IMD layer 108 is formed on the etch stop layer 106. In some embodiments, the IMD layer 108 is formed of a tetraethyl orthosilicate (TEOS) oxide (e.g., silicon oxide deposited using, e.g., a chemical vapor deposition (CVD) process with TEOS as a precursor). In some embodiments, the IMD layer 108 may be formed using PSG, BSG, BPSG, undoped silicate glass (USG), fluorosilicate glass (FSG), SiOCH, flowable oxide, a porous oxide, or the like, or combinations thereof. The IMD layer 108 may also be formed of a low-k dielectric material with a k value lower than about 3.0, for example. The IMD layer 108 can be formed to a thickness in the range of about 50 nm to about 150 nm.

Via openings 110 are patterned in the IMD layer 108. The via openings 110 may be formed using suitable photolithography and etching techniques. In some embodiments, an anti-reflective layer, such as a nitrogen-free anti-reflective coating (NFARC) (not shown) can be formed on the IMD layer 108 to protect the underlying layers during the patterning of via openings 110.

Figure 4:
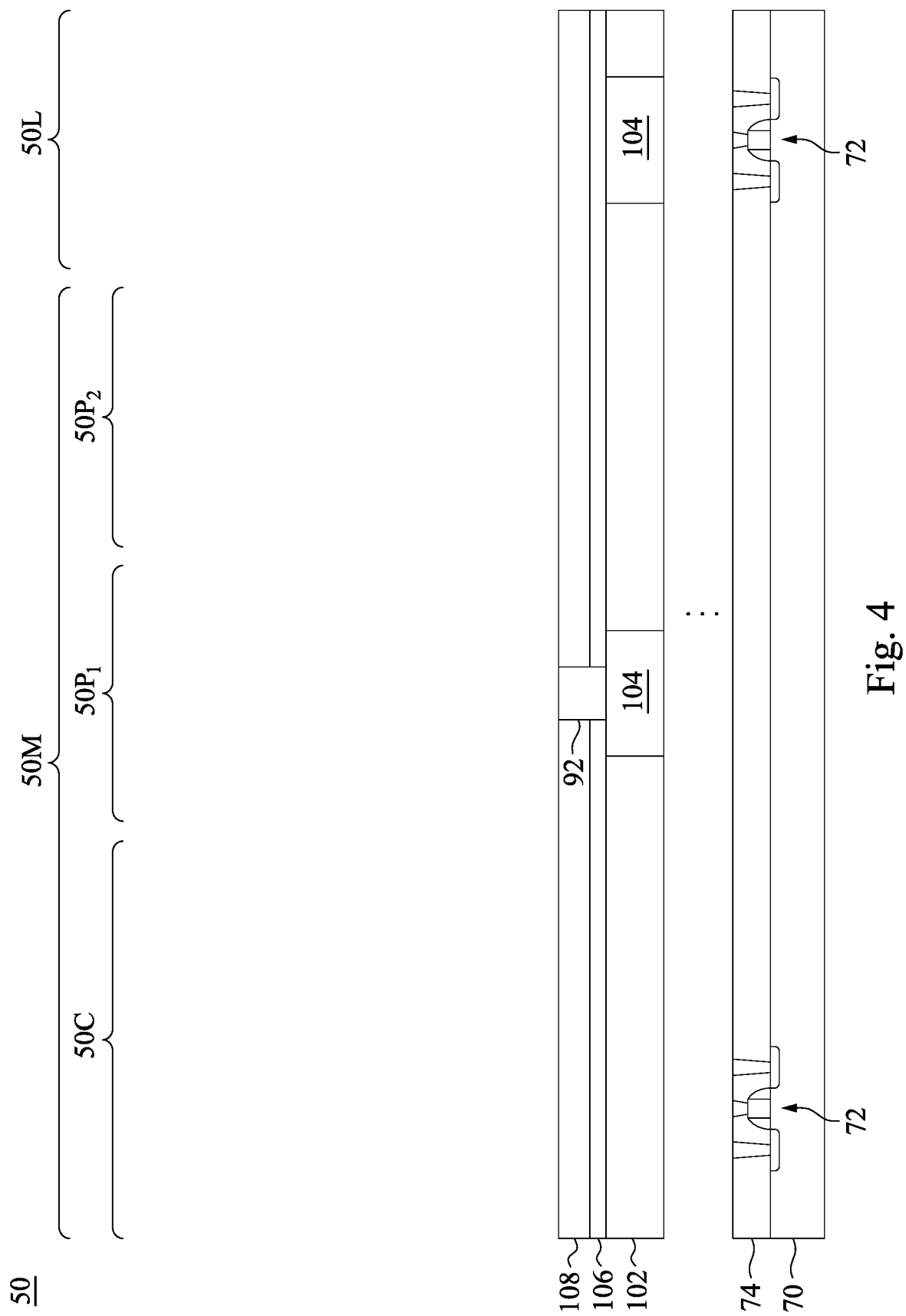

In FIG. 4, conductive vias 92 are formed in the via openings 110. The conductive vias 92 can also be referred to as BEVAs. In some embodiments, the conductive vias 92 include main conductive regions and conductive barrier layers lining sidewalls and bottom surfaces of the main conductive regions. The conductive barrier layers may be formed of titanium, titanium nitride, tantalum, tantalum nitride, cobalt, a combination thereof, or the like. The main conductive regions may be formed of metals such as copper, aluminum, tungsten, cobalt, alloys thereof, or the like. The formation of the conductive vias 92 may include conformally forming a conductive barrier layer extending into the via openings 110, depositing a metallic material over the conductive barrier layer, and performing a planarization process, such as a CMP process or a mechanical grinding process, to remove excess portions of the conductive barrier layer and the metallic material from the top surface of the IMD layer 108.

Figure 5:
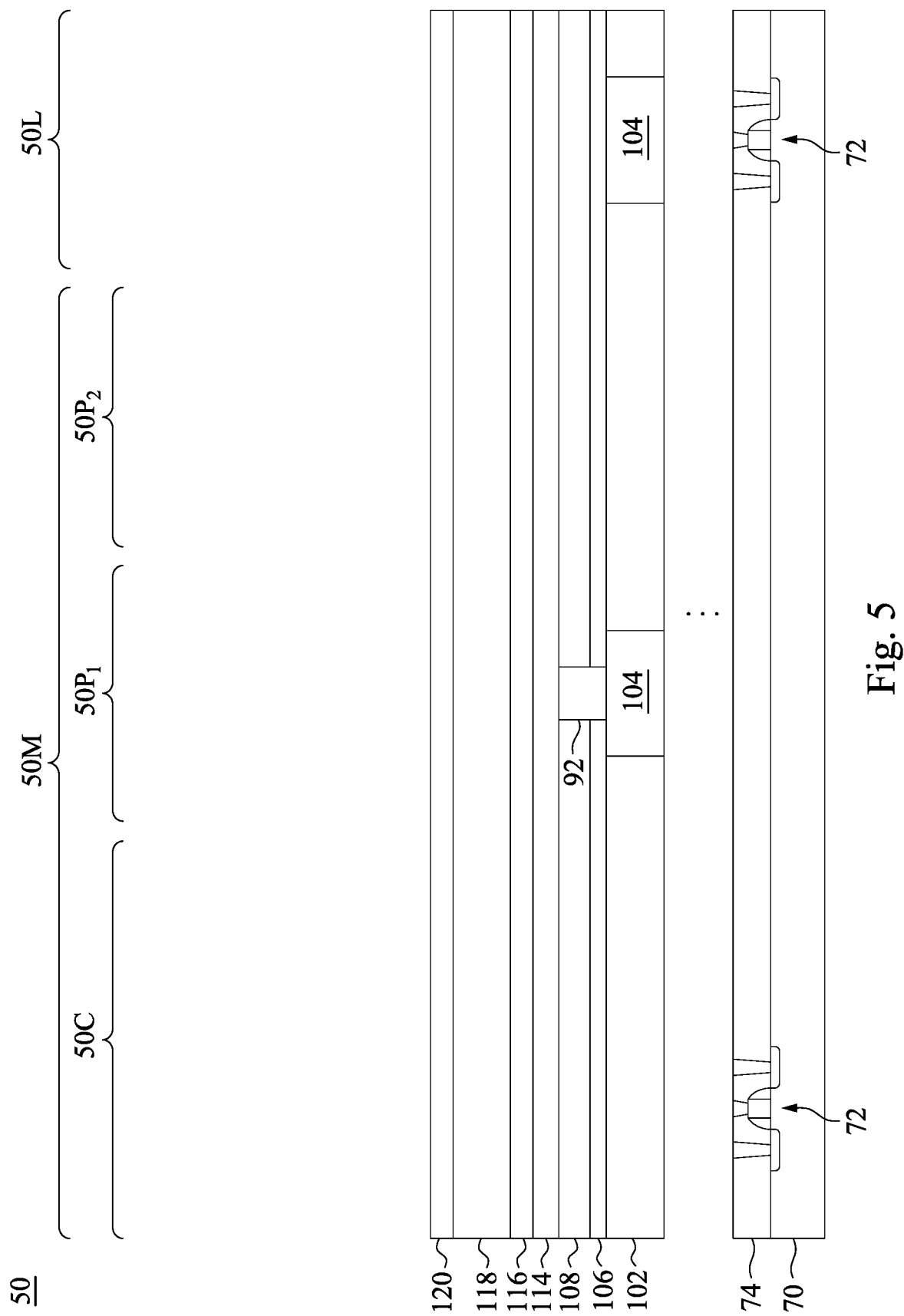

In FIG. 5, a plurality of memory cell layers are formed over the conductive vias 92 and the IMD layer 108. Specifically, a bit line layer 114, a bottom electrode layer 116, a PCM layer 118, and a top electrode layer 120 are deposited. The bit line layer 114 will be patterned in subsequent processing (see FIGS. 12A and 12B) to form bit lines 66 and bit line pads 68. The top electrode layer 120, the PCM layer 118, and the bottom electrode layer 116 will also be patterned in subsequent processing (see FIGS. 18A and 18B) to form, respectively, the top electrodes 86, the PCM elements 84, and the bottom electrodes 82 of respective PCRAM cells 58.

The bit line layer 114 is formed on the conductive vias 92 and the IMD layer 108. The bit line layer 114 is formed of a metal such as tungsten, titanium, cobalt, nickel, the like, or combinations thereof, and may be deposited by CVD, PVD, ALD, or the like. The bit line layer 114 is conformally formed, and may be formed using CVD, PVD, ALD, electro-chemical plating, electroless plating, or the like. In some embodiments, the bit line layer 114 is a layer of tungsten formed by CVD.

The bottom electrode layer 116 is formed on the bit line layer 114. The bottom electrode layer 116 is formed of a conductive material such as titanium, tantalum, aluminum, tungsten, platinum, nickel, chromium, ruthenium, nitrides thereof, combinations thereof, multilayers thereof, or the like. The bottom electrode layer 116 is conformally formed, and may be formed using CVD, PVD, ALD, electro-chemical plating, electroless plating, or the like. In some embodiments, the bottom electrode layer 116 is a layer of titanium nitride formed by PVD.

The PCM layer 118 is formed on the bottom electrode layer 116. The PCM layer 118 is formed of a chalcogenide material. Chalcogenide materials include at least a chalcogen anion (e.g., selenium (Se), tellurium (Te), and the like) and an electropositive element (e.g., germanium (Ge), silicon (Si), phosphorus (P), arsenic (As), antimony (Sb), bismuth (Bi), zinc (Zn), nitrogen (N), boron (B), carbon (C), and the like). An acceptable chalcogenide material includes, but is not limited to, $GeSb_2Te_5$ (GST). The PCM layer 118 is conformally formed, and may be formed using PVD, CVD, ALD, or the like. In some embodiments, the PCM layer 118 is a layer of GST formed by PVD. Forming the PCM layer 118 by PVD allows for a good film quality and may reduce gap-filling concerns.

The top electrode layer 120 is formed on the PCM layer 118. The top electrode layer 120 may be formed of a material that is selected from the same group of candidate materials of the bottom electrode layer 116, and may be formed using a method that is selected from the same group of candidate methods for forming the bottom electrode layer 116. The bottom electrode layer 116 and the top electrode layer 120 may be formed from the same material, or may include different materials.

Figure 11A:
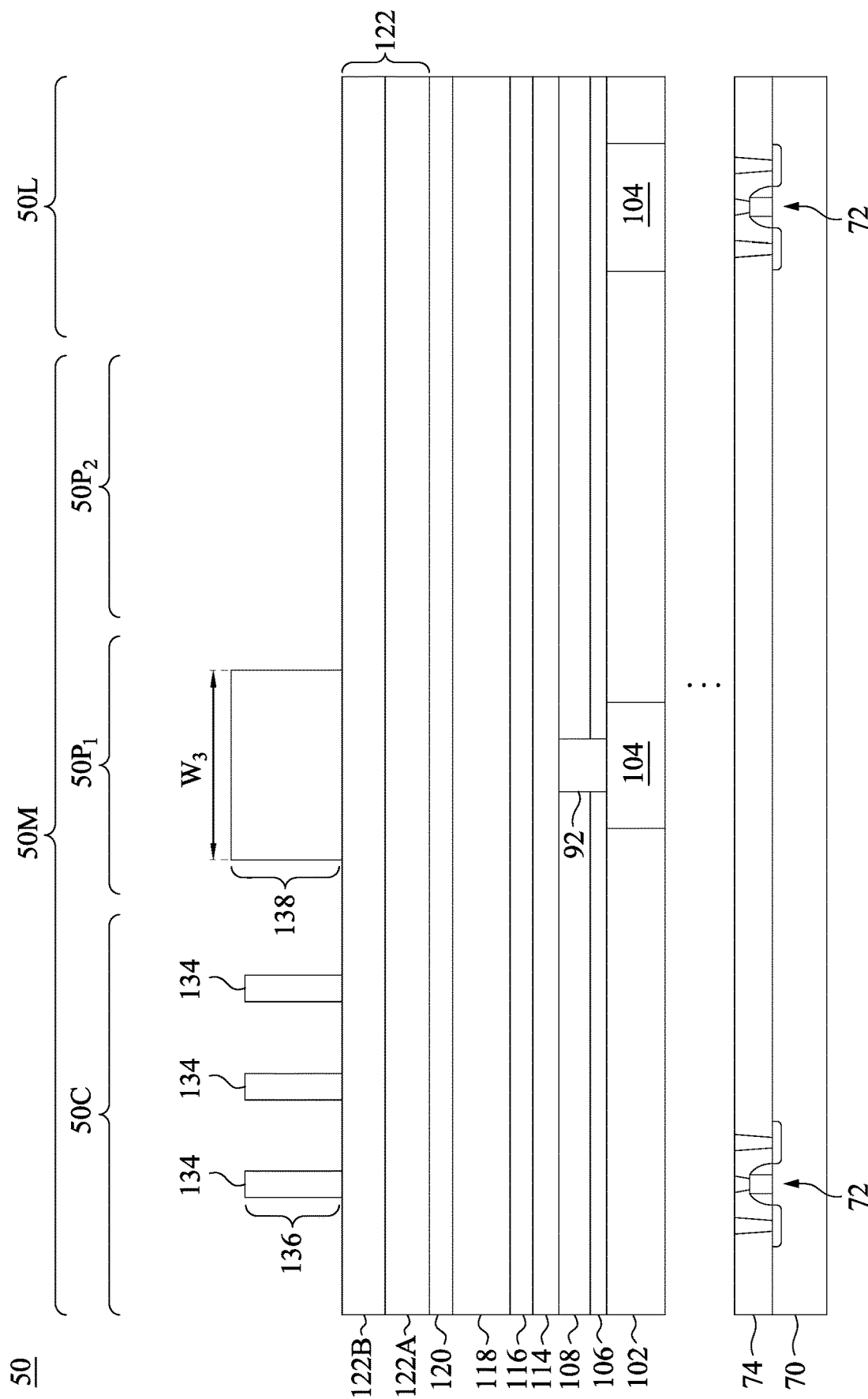
Figure 11B:
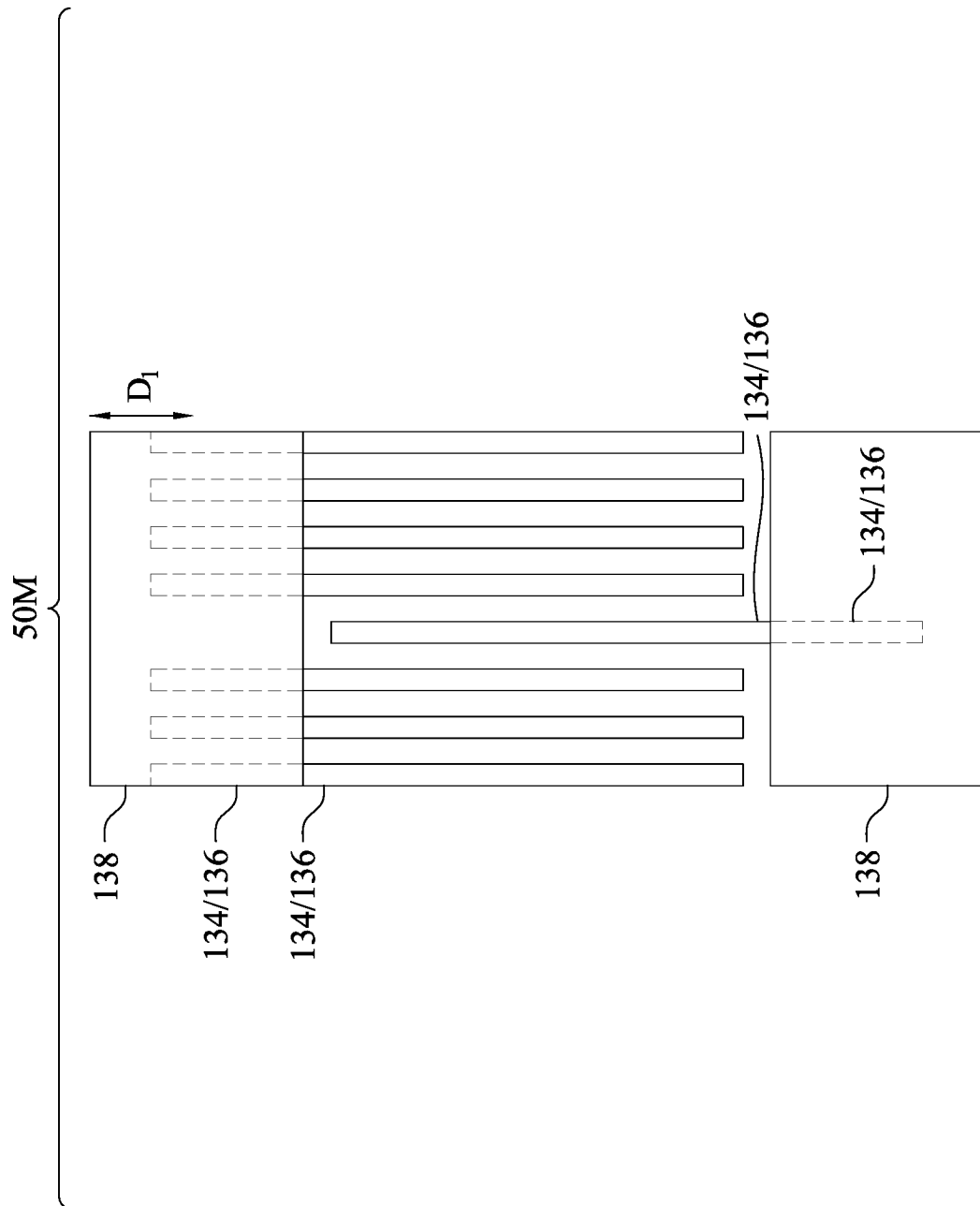
Figure 12A:
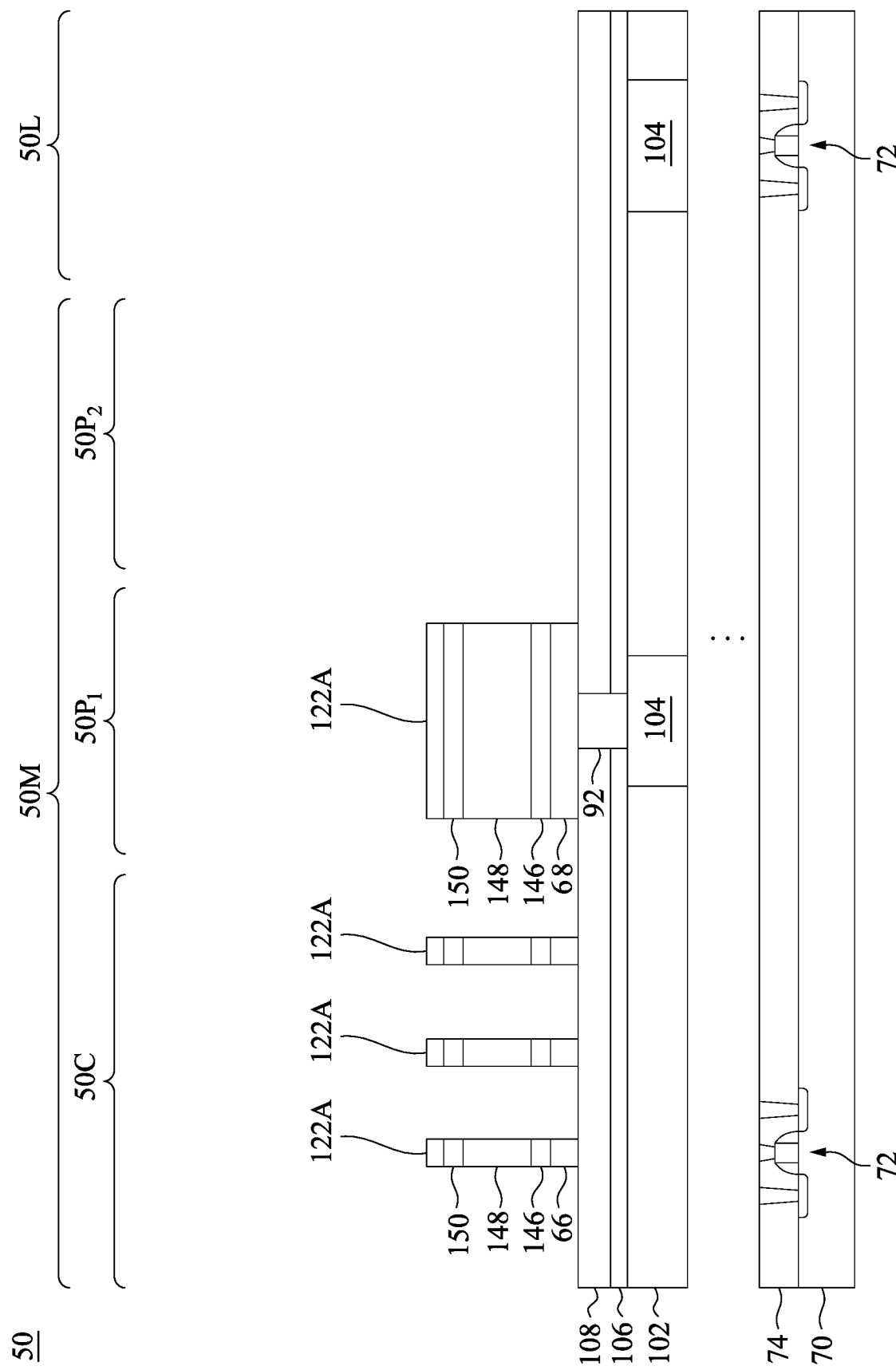

In FIGS. 6 through 12B, the bit line layer 114 is patterned to form bit lines 66 and bit line pads 68 (see FIGS. 12A and 12B). The top electrode layer 120, the PCM layer 118, and the bottom electrode layer 116 are also patterned to form top electrode strips 150, PCM strips 148, and bottom electrode strips 146 (see FIGS. 12A and 12B). This patterning process is the first of two patterning process performed to form the PCRAM cells 58 (see FIG. 2) in a self-aligned manner. In subsequent processing, the top electrode strips 150, the PCM strips 148, and the bottom electrode strips 146 will be patterned again to form the PCRAM cells 58.

As will be discussed in greater detail below, FIGS. 6 through 12B illustrate a process in which a first mask 136 (see FIG. 10) is formed having a pattern of the bit lines 66 and a second mask 138 (see FIGS. 11A and 11B) is formed having a pattern of the bit line pads 68. In the illustrated embodiment, the first mask 136 is formed with a multiple-patterning process and the second mask 138 is formed with a single-patterning process, so that the features of the first mask 136 can be smaller than the features of the second mask 138. The bit line layer 114 is then patterned using both masks 136, 138 as a combined etching mask to simultaneously form the bit lines 66 and the bit line pads 68 (see FIGS. 12A and 12B).

Figure 6:
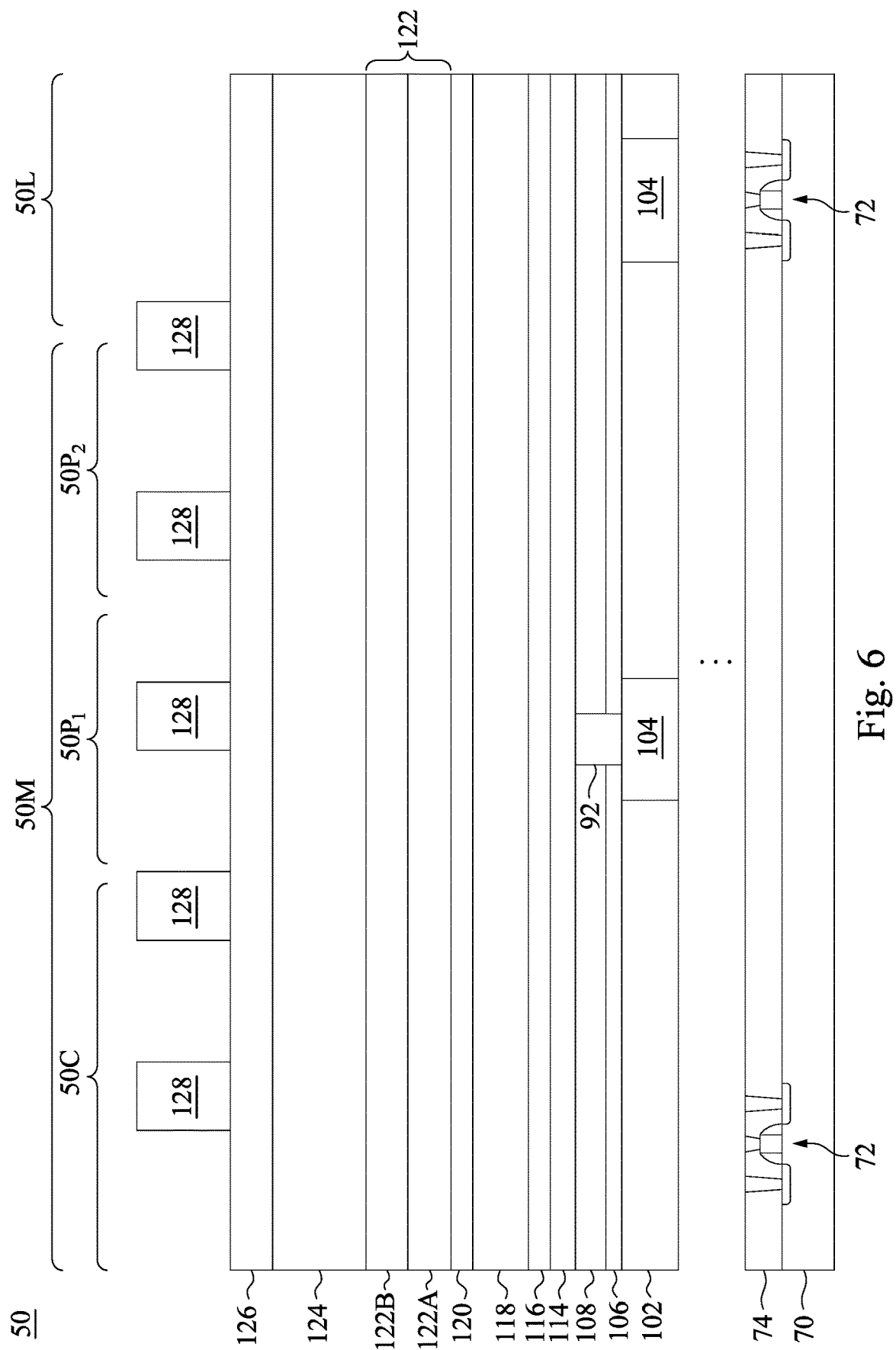

In FIG. 6, a plurality of masking layers are formed over the memory cell layers, e.g., over the top electrode layer 120. Specifically, one or more dielectric layers(s) 122 and a mandrel layer 124 are deposited. The dielectric layers(s) 122 will be patterned to form etching masks, which will be used in subsequent processing to pattern the bit line layer 114.

The dielectric layers(s) 122 are formed on the top electrode layer 120. In the illustrated embodiment, the dielectric layers(s) 122 include a first dielectric layer 122A over the top electrode layer 120 and a second dielectric layer 122B over the first dielectric layer 122A. The first dielectric layer 122A may be a mask layer, such as a hard mask layer; may be formed of a nitride such as silicon nitride, silicon oxynitride, titanium nitride, or the like; and may be formed by deposition such as by PECVD, ALD, or the like. The second dielectric layer 122B may be a pad layer; may be formed of an oxide such as silicon oxide, a TEOS oxide, or the like; and may be formed by deposition such as by PECVD, ALD, or the like.

The mandrel layer 124 is formed on the dielectric layers(s) 122, e.g., on the second dielectric layer 122B. The mandrel layer 124 is formed of a material that has a high etching selectivity from the etching of the underlying layer(s), e.g., the dielectric layers(s) 122. The mandrel layer 124 may be formed of a material such as amorphous silicon, polysilicon, silicon nitride, silicon oxide, the like, or combinations thereof, and may be formed using a process such as a CVD, PECVD, or the like.

One or more masks are formed over the mandrel layer 124. The masks will be used to pattern the mandrel layer 124 and form mandrels. In some embodiments, the one or more masks may comprise one or more hard masks, a trilayer mask, a combination thereof, or the like. For example, a hard mask layer 126 can be formed over the mandrel layer 124 and a photosensitive mask 128 can be formed over the hard mask layer 126. In some embodiments, the hard mask layer 126 is formed of an oxide such as silicon oxynitride, silicon oxide, titanium oxide, a combination thereof, or the like. The photosensitive mask 128 may be a photoresist, such as a single-layer photoresist, a bilayer photoresist, a trilayer photoresist, or the like.

Figure 7:
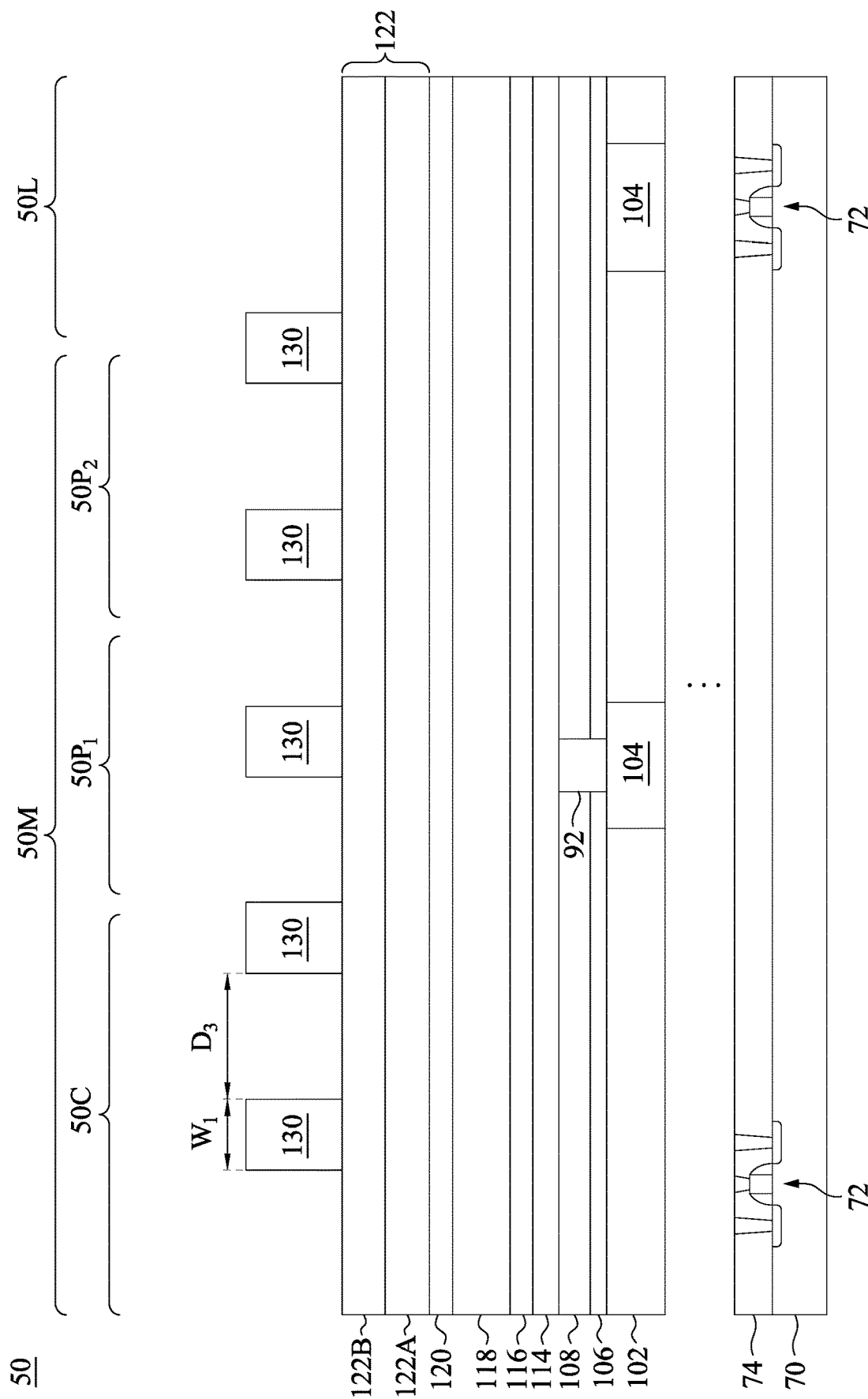

In FIG. 7, the mandrel layer 124 is patterned to form mandrels 130. In the illustrated embodiment, the pattern of the photosensitive mask 128 is transferred to the hard mask layer 126, and the pattern of the hard mask layer 126 is then transferred to the mandrel layer 124. Each pattern may be transferred by an acceptable etch process, such as a reactive ion etch (RIE), neutral beam etch (NBE), the like, or a combination thereof. The etch may be anisotropic. In some embodiment, the final etch is selective to the mandrel layer 124, e.g., selectively etches the material of the mandrel layer 124 at a faster rate than the material of the underlying dielectric layer 122, e.g., the second dielectric layer 122B. The photosensitive mask 128 and the hard mask layer 126 can optionally be removed with the material of the mandrel layer 124, or can be removed in a subsequent cleaning process.

After the patterning, the mandrels 130 can be separated by a spacing distance $D_3$ in the range of about 40 nm to about 80 nm. Each of the mandrels 130 can have a width $W_1$ in the range of about 40 nm to about 80 nm. The mandrels 130 will be used to pattern spacers over the dielectric layer(s) 122. The spacing distance $D_3$ and the width $W_1$ of the mandrels 130 determines the spacing distance between the subsequently patterned spacers.

Figure 8:
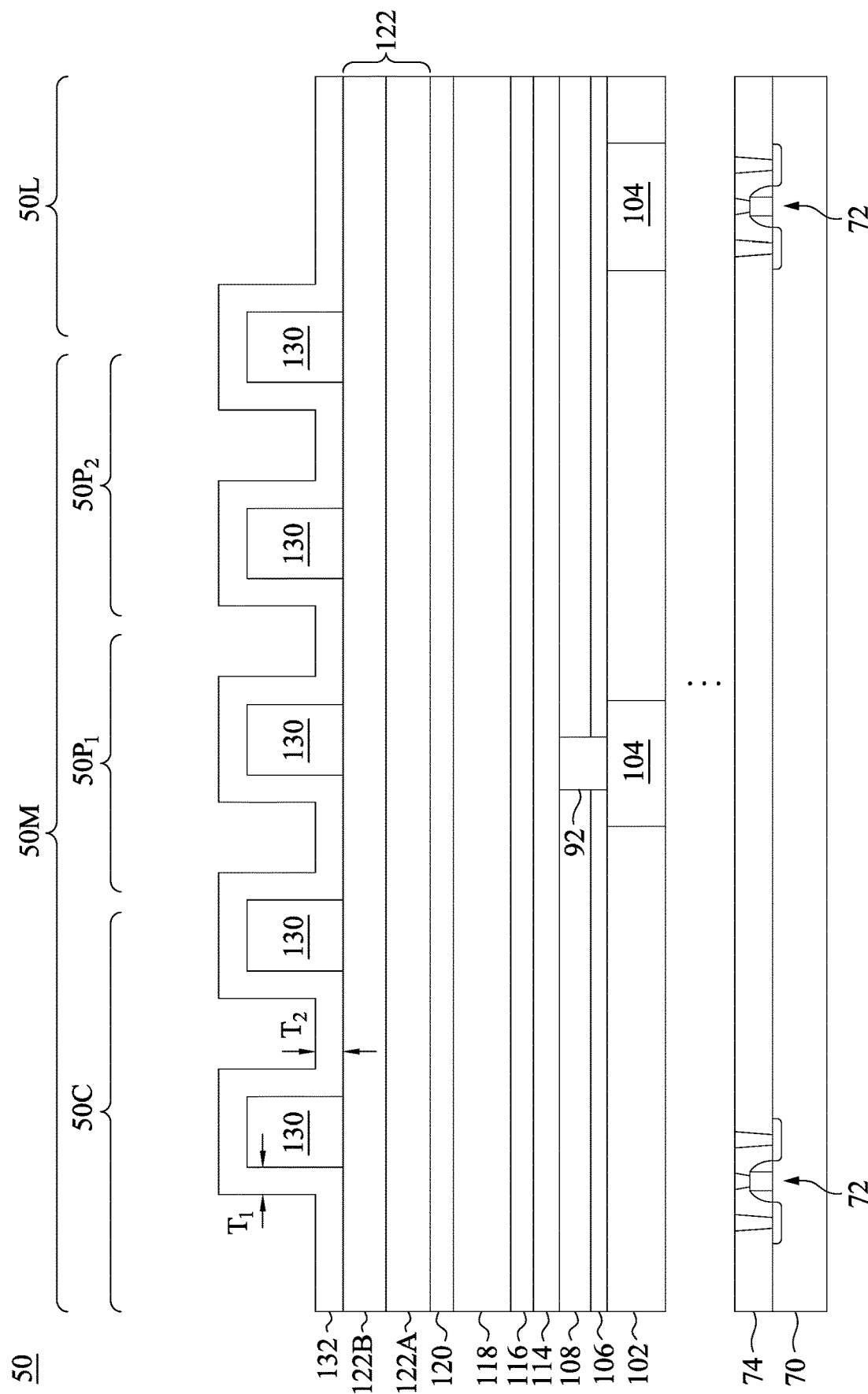

In FIG. 8, a spacer layer 132 is formed over the mandrels 130 and the dielectric layer(s) 122. After formation, the spacer layer 132 extends along the top surfaces of the mandrels 130, the sidewalls of the mandrels 130, and the top surface of the underlying dielectric layer 122, e.g., the second dielectric layer 122B. The spacer layer 132 is formed of a material that has a high etching selectivity from the etching of the underlying layer(s), e.g., the dielectric layer(s) 122. The spacer layer 132 may be formed from silicon nitride, aluminum oxide, aluminum nitride, tantalum nitride, titanium nitride, titanium oxide, the like, or combinations thereof, and may be formed using a process such as ALD, CVD, or the like. The spacer layer 132 has a high degree of conformality, with the thickness $T_1$ of its vertical portions being equal to or slightly less than the thickness $T_2$ of its horizontal portions. For example, the thickness $T_1$ can be from about 80% to about 100% of the thickness $T_2$. The thickness $T_1$ can be in the range of about 15 nm to about 30 nm and the thickness $T_2$ can be in the range of about 15 nm to about 30 nm. The spacer layer 132 will be patterned to form spacers over the dielectric layer(s) 122. The thickness $T_1$ of the vertical portions of the spacer layer 132 determines the width of the subsequently patterned spacers.

Figure 9:
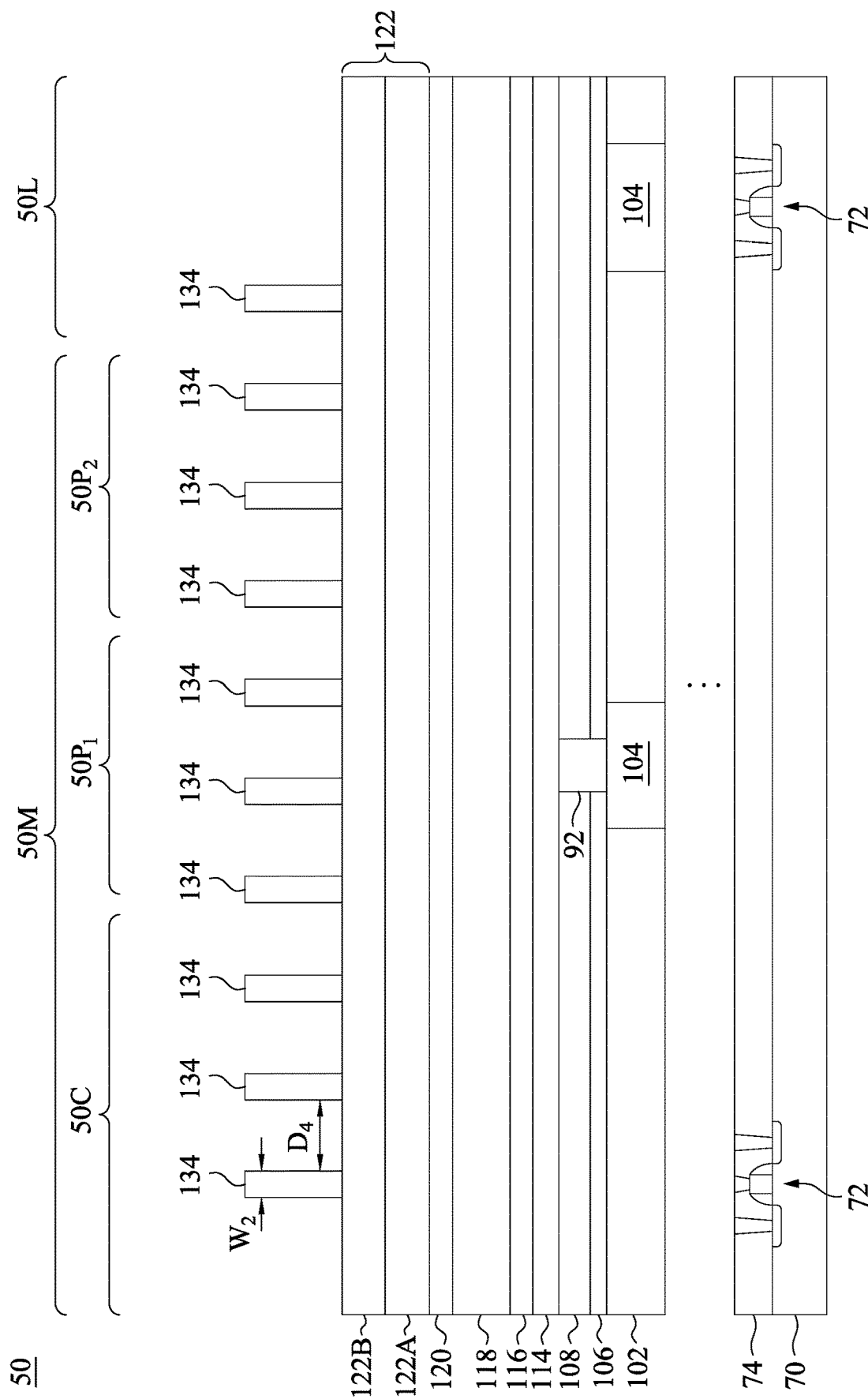

In FIG. 9, the spacer layer 132 is patterned to form spacers 134 over the dielectric layer(s) 122. A suitable etching process is performed to remove the horizontal portions of the spacer layer 132. The etching process selectively etches the horizontal portions of the spacer layer 132 at a faster rate than the mandrels 130 and the vertical portions of the spacer layer 132. For example, when the spacer layer 132 is formed of silicon nitride, the etching process can be an anisotropic dry etch performed with methane ($CH_4$), chlorine ($Cl_2$), nitrogen ($N_2$), or the like. After the etching process, the spacers 134 comprise the remaining vertical portions of the spacer layer 132. The mandrels 130 can optionally be removed with the horizontal portions of the spacer layer 132, or can be removed in a subsequent cleaning process. In some embodiments, the mandrels 130 are removed after the spacers 134 are formed, and can be removed by a suitable etching processes that selectively etches the mandrels 130 at a faster rate than the spacers 134.

After the patterning, the spacers 134 have a width $W_2$ and are separated by a spacing distance $D_4$. The spacing distance $D_4$ between the spacers 134 can be in the range of about 20 nm to about 50 nm, and the width $W_2$ of the spacers 134 can be in the range of about 15 nm to about 30 nm. As noted above, the spacing distance $D_3$ and the width $W_1$ (see FIG. 7) of the mandrels 130 determines the spacing distance $D_4$ between the spacers 134, and the thickness $T_1$ (see FIG. 8) of the vertical portions of the spacer layer 132 determines the width $W_2$ of the spacers 134. Because selective etching process are used to form the spacers 134, the thickness $T_1$ of the vertical portions of the spacer layer 132 decreases by a small amount when forming the spacers 134. The spacers 134 will be used to pattern the bit line layer 114. The spacing distance $D_4$ and the width $W_2$ of the spacers 134 determines the spacing distance and the width of the resulting bit lines 66 (see FIGS. 12A and 12B).

Figure 10:
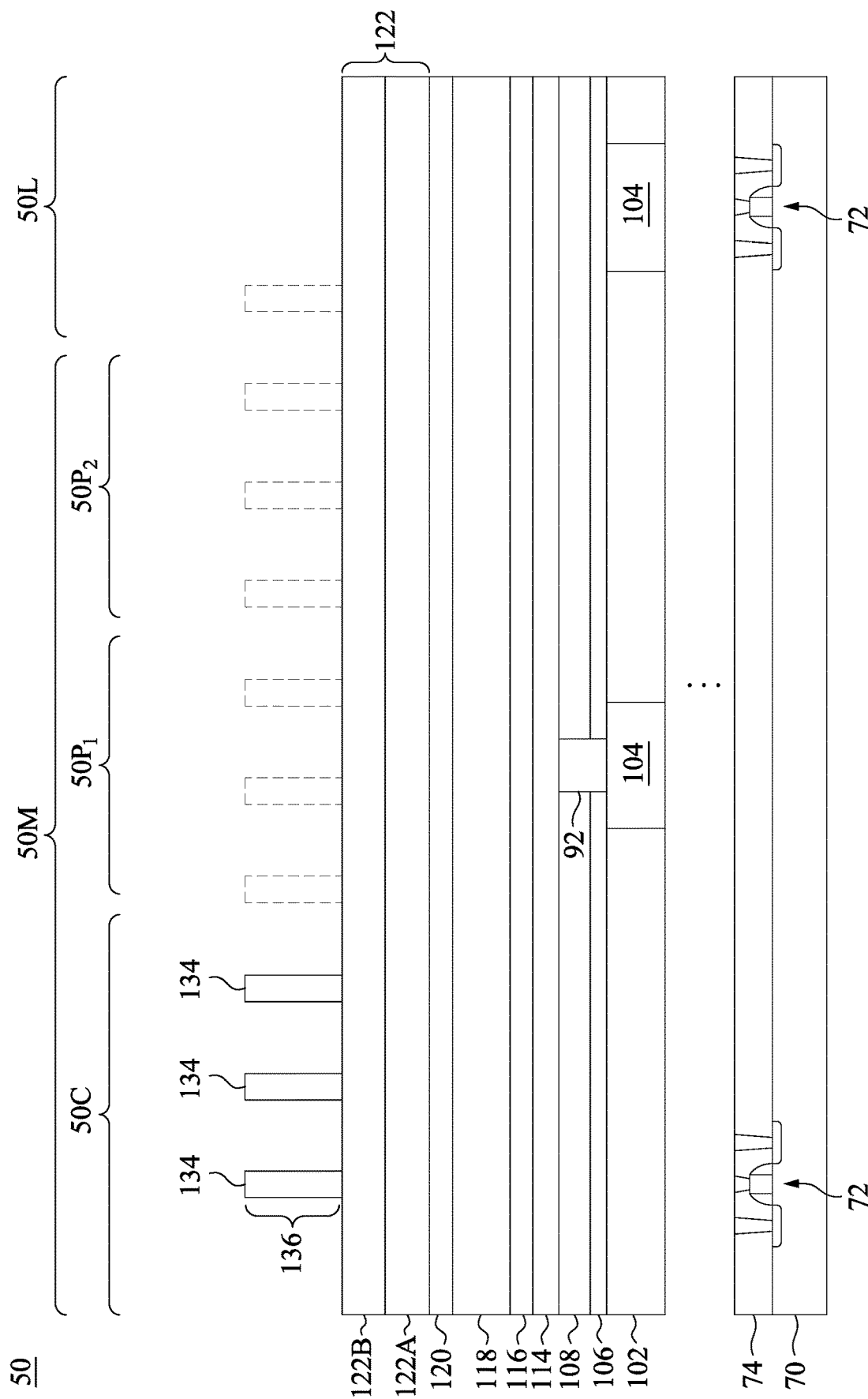

In FIG. 10, the spacers 134 in undesired locations are removed in a cut process. The cut process may be performed using suitable photolithography and etching techniques. For example, a first subset of the spacers 134 may be covered with, e.g., a mask such as a photoresist, and an uncovered second subset of the spacers 134 may then be removed with an etch that selectively etches the material of the spacers 134 at a faster rate than the material of the underlying dielectric layer 122, e.g., the second dielectric layer 122B. In some embodiments, the spacers 134 are initially formed in both the logic region 50L and memory region 50M, and the cut process is used to remove the spacers 134 from the logic region 50L, the first pad region $50P_1$, and the second pad region $50P_2$ so that the spacers 134 only remain in the cell region 50C. The remaining spacers 134 form a first mask 136 in the cell region 50C.

In FIG. 11A, a second mask 138 is formed in the first pad region $50P_1$. The second mask 138 may be photosensitive mask, such as a photoresist, such as a single-layer photoresist, a bilayer photoresist, a trilayer photoresist, or the like. The second mask 138 is not formed by patterning spacers, and as such, the features of the second mask 138 are larger than the features of the first mask 136. For example, the features of the second mask 138 can have a width $W_3$ that is larger than the width $W_2$ (see FIG. 9). For example, the width $W_3$ can be in the range of about 50 nm to about 500 nm.

As shown by FIG. 11B, portions of the first mask 136 and portions of the second mask 138 overlap. Thus, some of the patterned features will be continuous with one another. Further, as will be discussed in greater detail below, the bit lines 66 extend along the same direction $D_1$ (see FIG. 12B). The spacers 134, which will be used to pattern the bit lines 66, thus also extend along the same direction $D_1$.

In FIG. 12A, the masks 136, 138 are used as a combined etching mask to etch and pattern the dielectric layer(s) 122. At least one of the dielectric layer(s) 122, e.g., the first dielectric layer 122A, remains after the etching and forms a patterned hard mask. The patterned hard mask is then used as an etching mask to etch and pattern the top electrode layer 120, the PCM layer 118, the bottom electrode layer 116, and the bit line layer 114. The patterning may include one or more etching processes. The etching method may include a plasma etching method, such as ion beam etching (IBE). IBE offers a high level of precision (e.g., high anisotropism), which can help control the profile of the resulting bit lines 66. The etching may be implemented using glow discharge plasma (GDP), capacitive coupled plasma (CCP), inductively coupled plasma (ICP), or the like. The first mask 136, the second mask 138, and/or the dielectric layer(s) 122 may be consumed in the etching process, or may be removed after the etching process. In the illustrated embodiment, the first dielectric layer 122A remains after the etching process.

The etching process forms bit lines 66 and bit line pads 68. The bit lines 66 and the bit line pads 68 are disposed beneath the top electrode strips 150. The bit lines 66 and the bit line pads 68 comprise remaining portions of the bit line layer 114.

The etching process also forms top electrode strips 150, PCM strips 148, and bottom electrode strips 146. The top electrode strips 150, the PCM strips 148, and the bottom electrode strips 146 comprise remaining portions of the top electrode layer 120, the PCM layer 118, and the bottom electrode layer 116, respectively. Although not shown, it should be appreciated that the patterned layers can have sloped sidewalls, and can have trapezoidal shapes in the illustrated cross-section. Each of the patterned layers has the same shape in the top-down view as the combined shape of the masks 136, 138 (see FIG. 11B).

As shown by FIG. 12B, each of the bit lines 66 are metal strips that extend along the same direction $D_1$ and emanate from a bit line pad 68. Thus, although the bit lines 66 and the bit line pads 68 are illustrated as separate elements, it should be appreciated that each bit line pad 68 and its corresponding bit lines 66 are actually a single continuous conductive feature that is patterned from the bit line layer 114. In other words, the patterning shown in FIG. 12A forms first conductive features that have bit line portions and bit line pad portions.

It should be appreciated that FIGS. 6 through 12B illustrate an example process for patterning the bit line layer 114, and other processes may be used to pattern the bit line layer 114. For example, the bit line layer 114 may also be patterned using next-generation lithography techniques such as extreme ultraviolet (EUV) lithography, deep ultraviolet (DUV) lithography, X-ray lithography, soft X-ray (SX) lithography, ion beam projection lithography, electron-beam projection lithography, or the like. The use of next-generation lithography techniques may allow the bit line layer 114 to be patterned by a single-patterning photolithography process, obviating the need for multiple-patterning photolithography processes.

Figure 13:
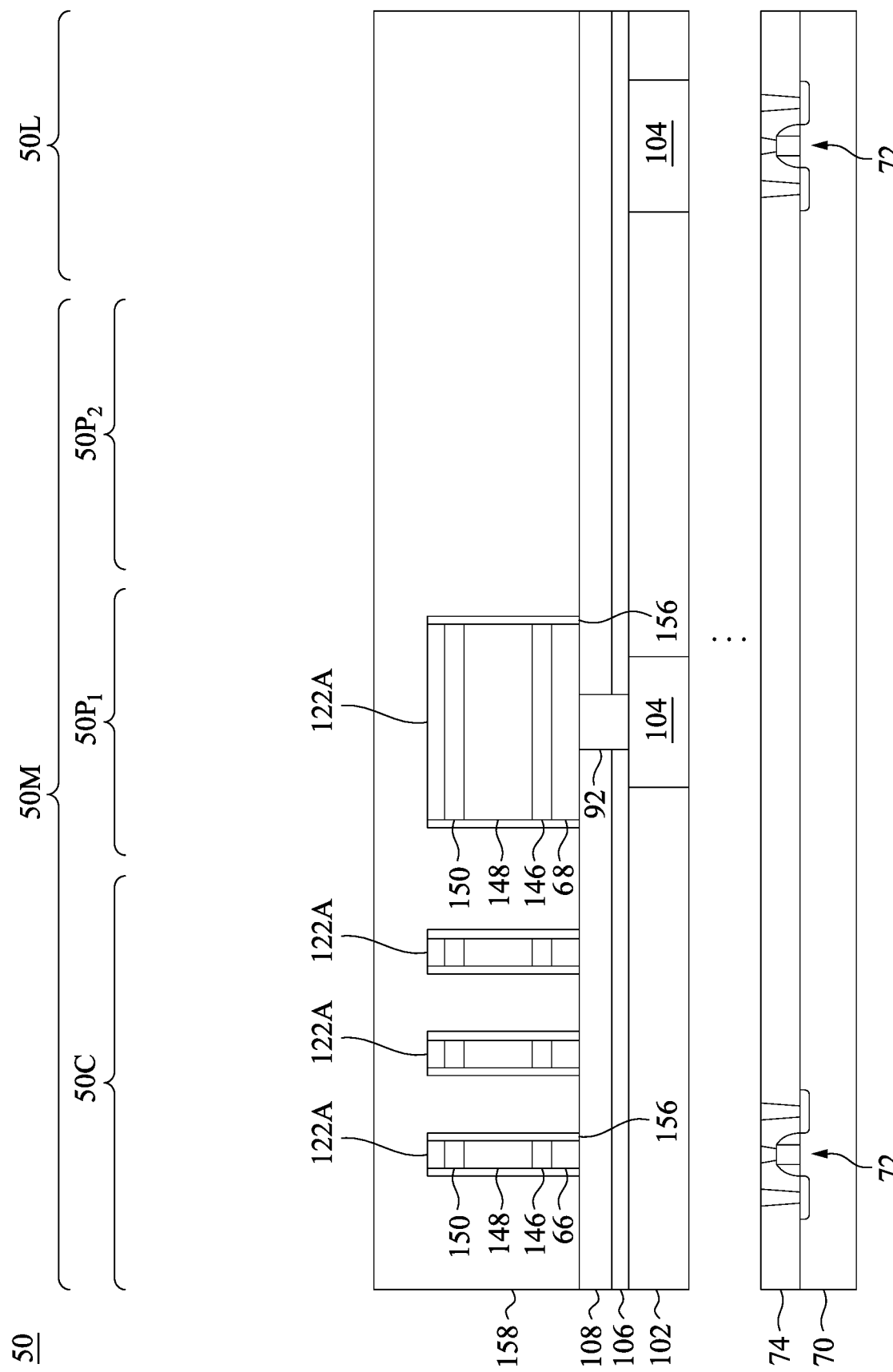

In FIG. 13, spacers 156 are formed on the sidewalls of the bit line pads 68 and the bit lines 66. The spacers 156 are also formed on the sidewalls of the top electrode strips 150, the PCM strips 148, and the bottom electrode strips 146. The spacers 156 may be formed by conformally depositing an insulating material and then etching the insulating material. The insulating material may be a nitride (e.g., silicon nitride, aluminum nitride, etc.), an oxide (e.g., silicon oxide, aluminum oxide, etc.), a carbide (e.g., silicon carbide), combinations thereof (e.g., silicon oxynitride, silicon carbonitride, etc.), multilayers thereof, or the like. The etch may be anisotropic.

An IMD layer 158 is then formed over the spacers 156, the IMD layer 108, and the first dielectric layer 122A (if present) or the top electrode strips 150. The IMD layer 158 may be formed of a material that is selected from the same group of candidate materials of the IMD layer 108, and may be formed using a method that is selected from the same group of candidate methods for forming the IMD layer 108. The IMD layer 108 and the IMD layer 158 may be formed from the same material, or may include different materials.

Figure 14:
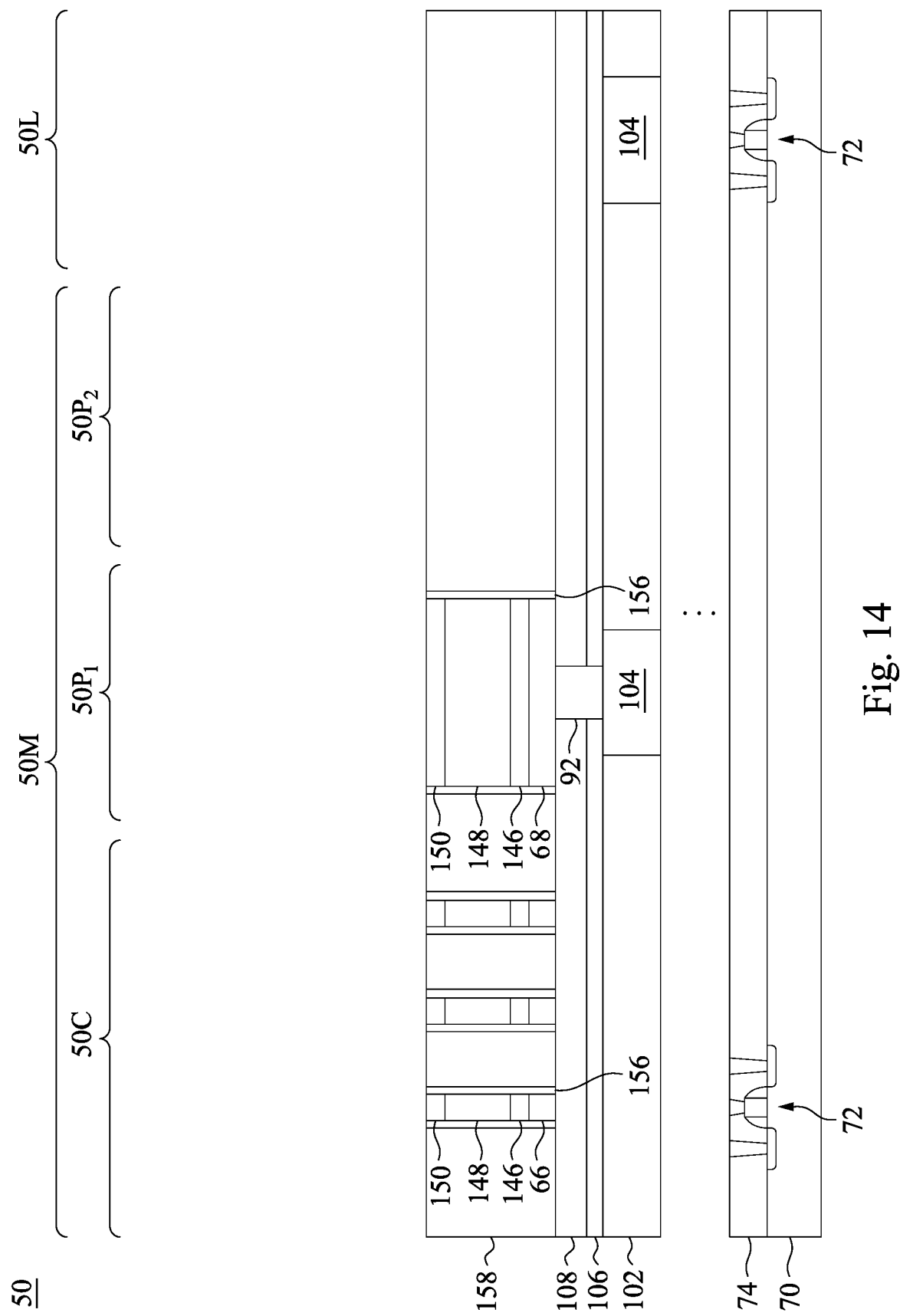

In FIG. 14, a planarization process is performed to remove excess material of the IMD layer 158. The planarization process can be a CMP, mechanical grinding, an etchback, or the like. The planarization process removes the first dielectric layer 122A (if present) to expose the top electrode strips 150. After the planarization process, top surfaces of the IMD layer 158, the spacers 156, and the top electrode strips 150 are coplanar (within process variations).

Figure 15:
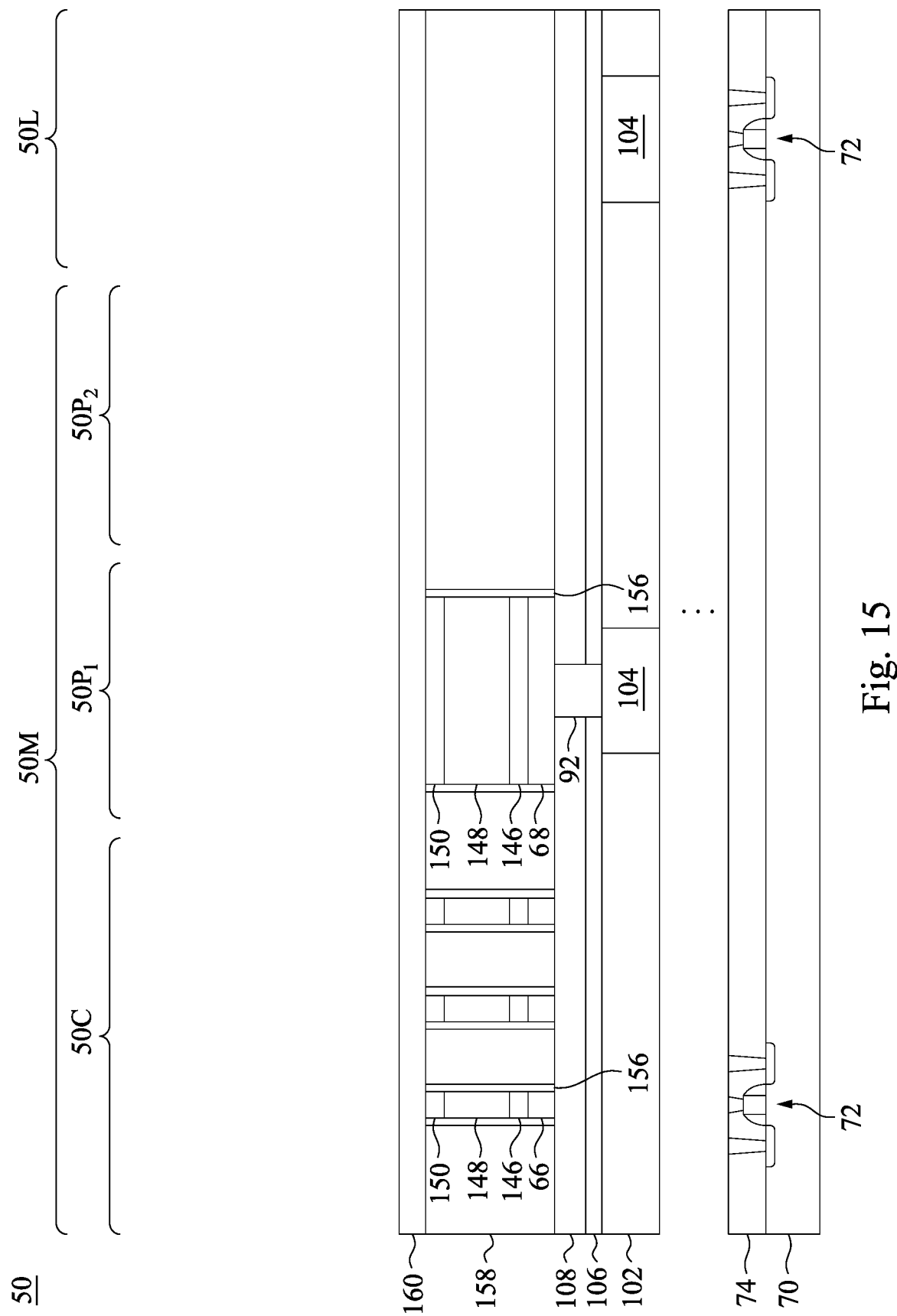

In FIG. 15, a word line layer 160 is formed on the planarized top surfaces of the IMD layer 158, the spacers 156, and the top electrode strips 150. The word line layer 160 may be formed of a material that is selected from the same group of candidate materials of the bit line layer 114, and may be formed using a method that is selected from the same group of candidate methods for forming the bit line layer 114. The bit line layer 114 and the word line layer 160 may be formed from the same material, or may include different materials.

Figure 17A:
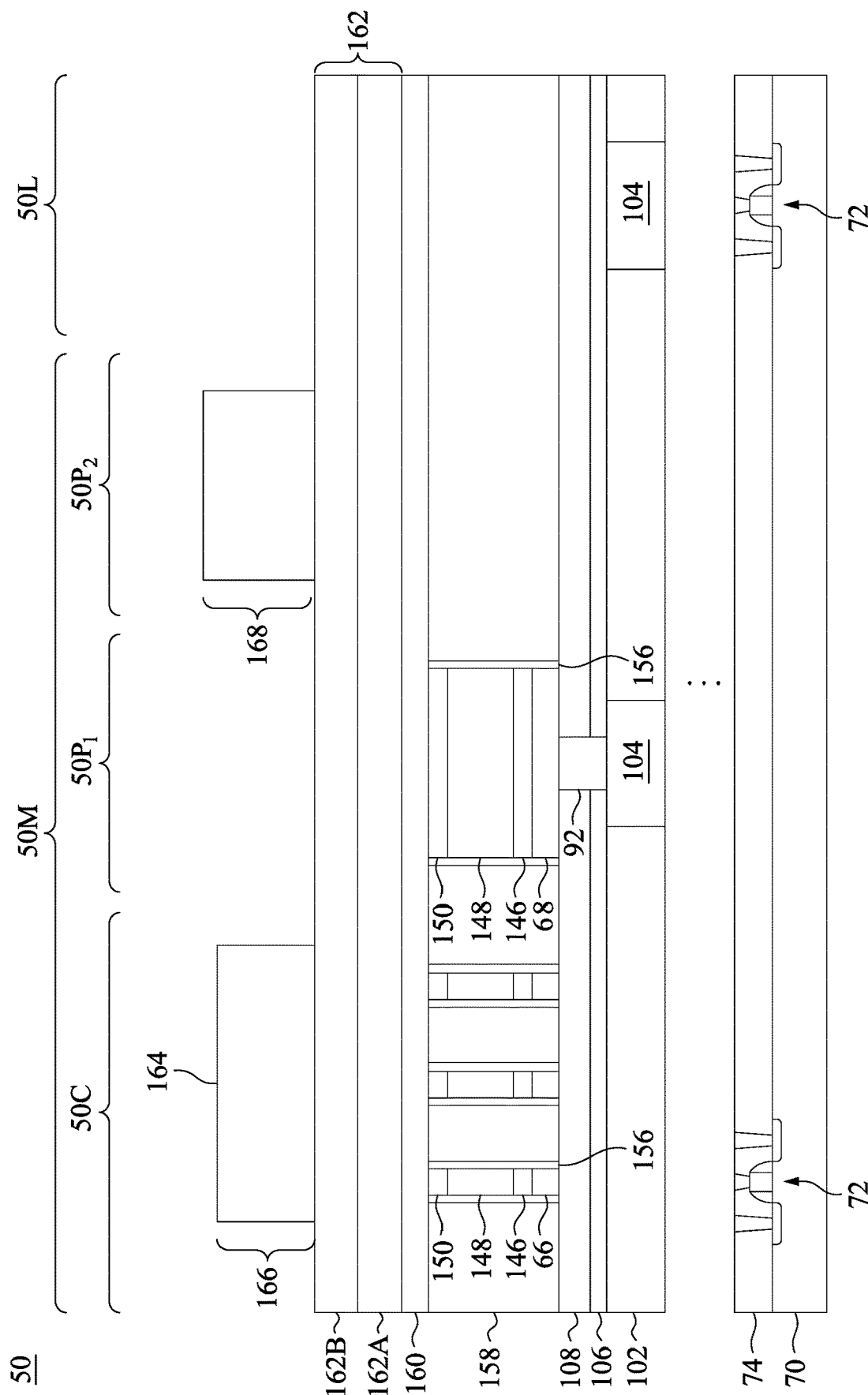
Figure 17B:
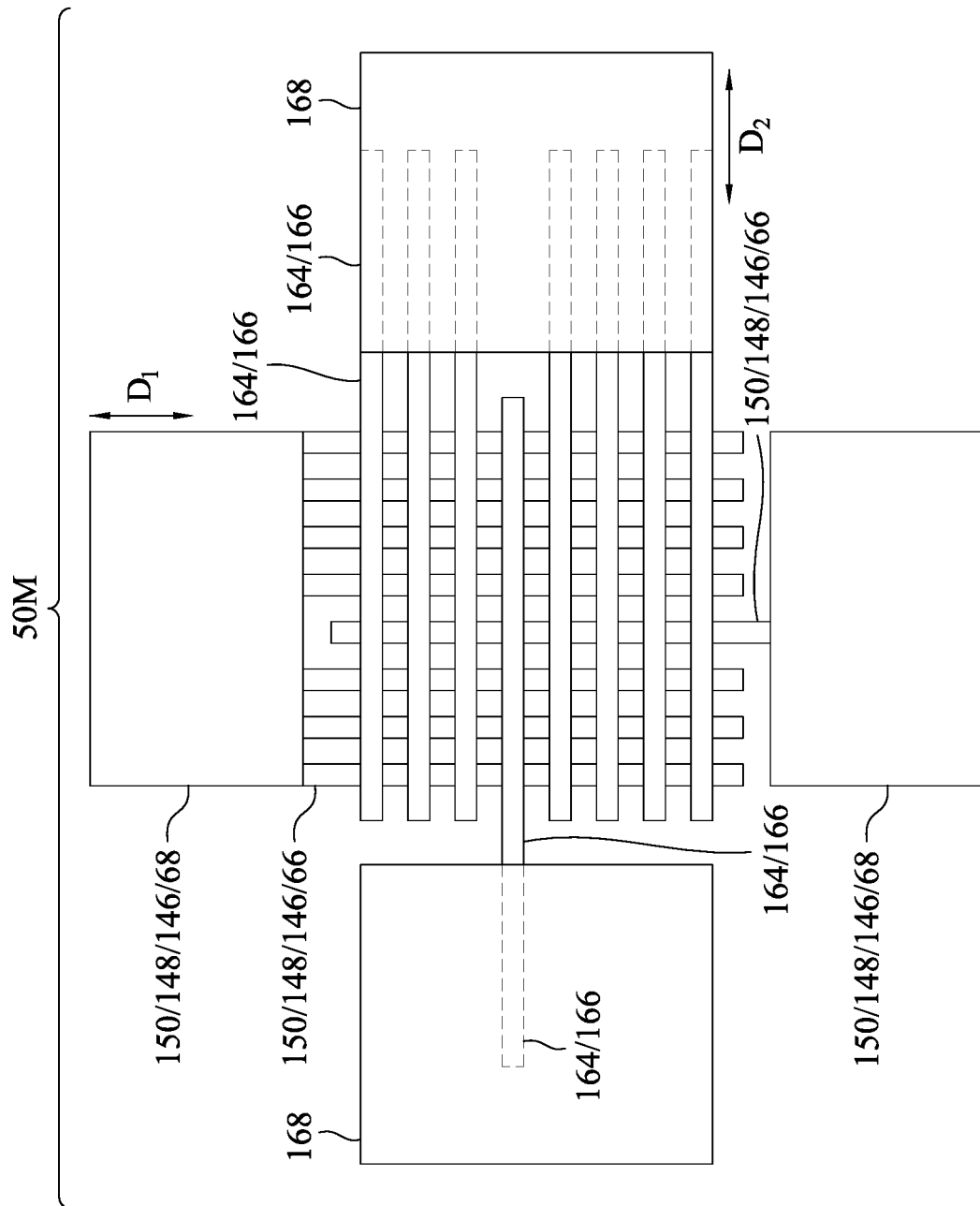
Figure 18A:
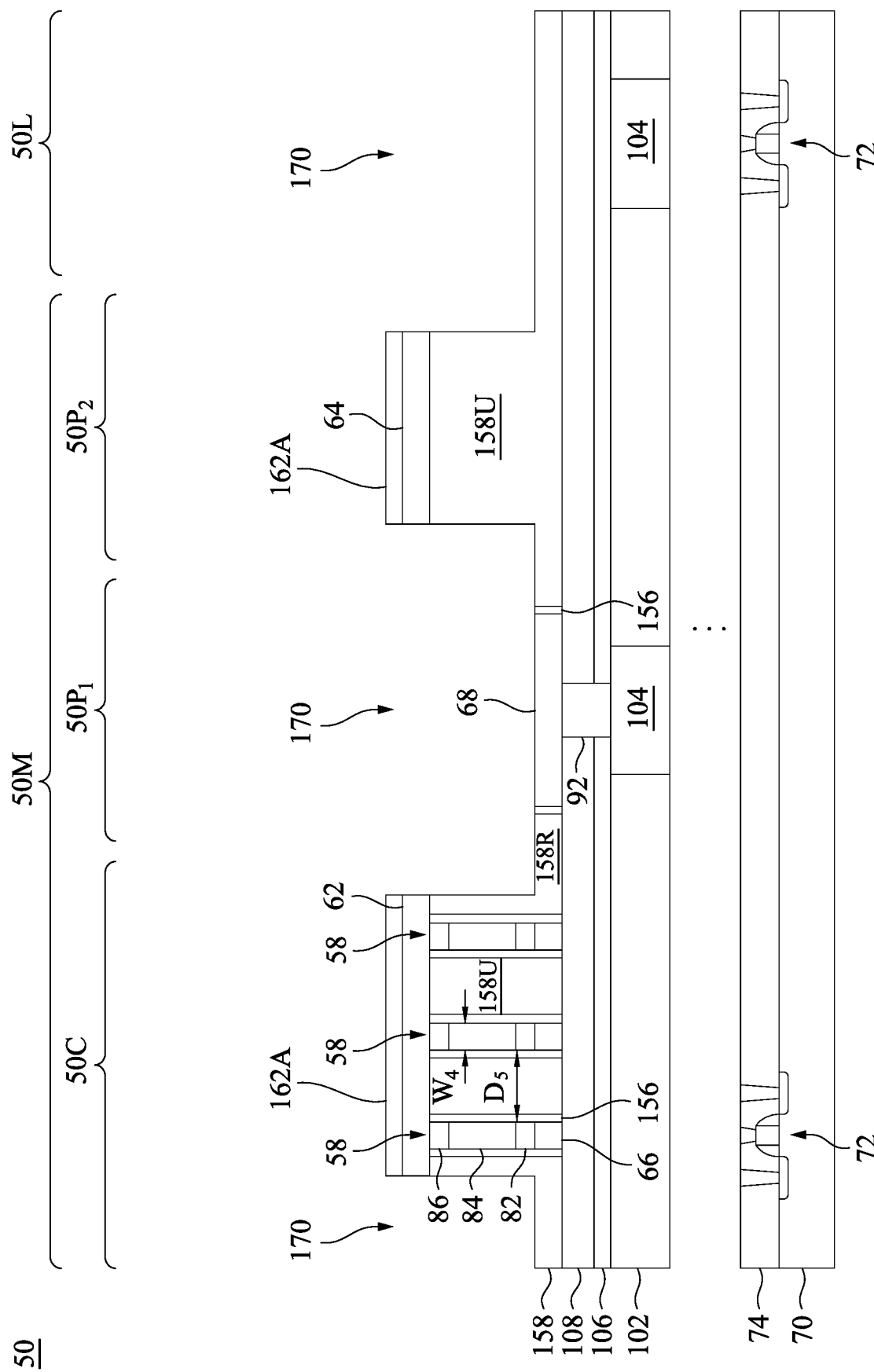
Figure 18B:
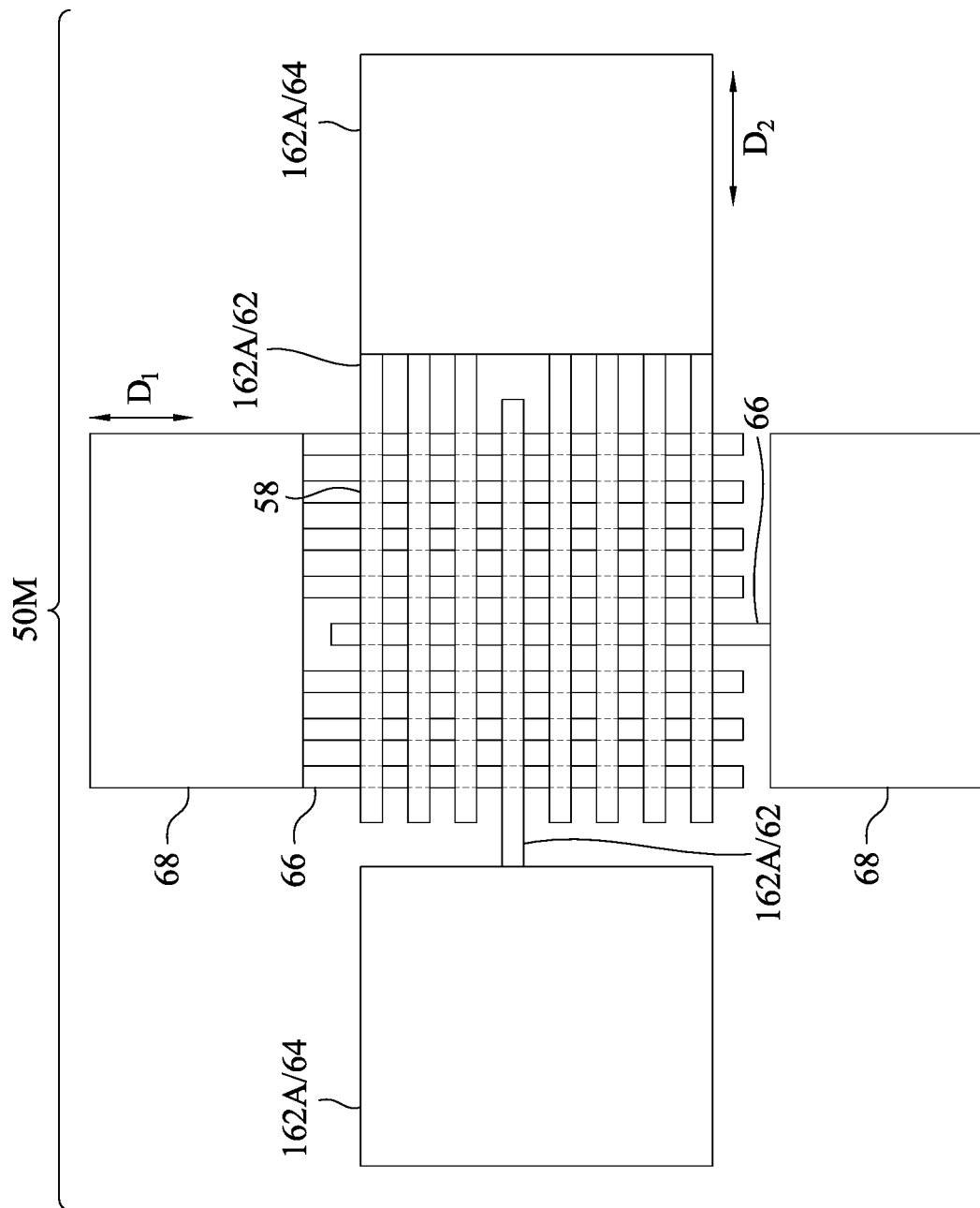

In FIGS. 16 through 18B, the word line layer 160 is patterned to form word lines 62 and word line pads 64 (see FIGS. 18A and 18B). The top electrode strips 150, the PCM strips 148, and the bottom electrode strips 146 are also patterned during the process for patterning the word line layer 160, thus forming PCRAM cell 58 (see FIGS. 18A and 18B). This patterning process is the second of the two patterning process performed to form the PCRAM cells 58 (see FIGS. 18A and 18B) in a self-aligned manner.

As will be discussed in greater detail below, FIGS. 16 through 18B illustrate a process in which a third mask 166 (see FIG. 16) is formed having a pattern of the word lines 62 and a fourth mask 168 (see FIGS. 17A and 17B) is formed having a pattern of the word line pads 64. In the illustrated embodiment, the third mask 166 is formed with a multiple-patterning process and the fourth mask 168 is formed with a single-patterning process, so that the features of the third mask 166 can be smaller than the features of the fourth mask 168. The word line layer 160 is then patterned using both masks 166, 168 as a combined etching mask to simultaneously form the word lines 62 and the word line pads 64 (see FIGS. 18A and 18B).

Figure 16:
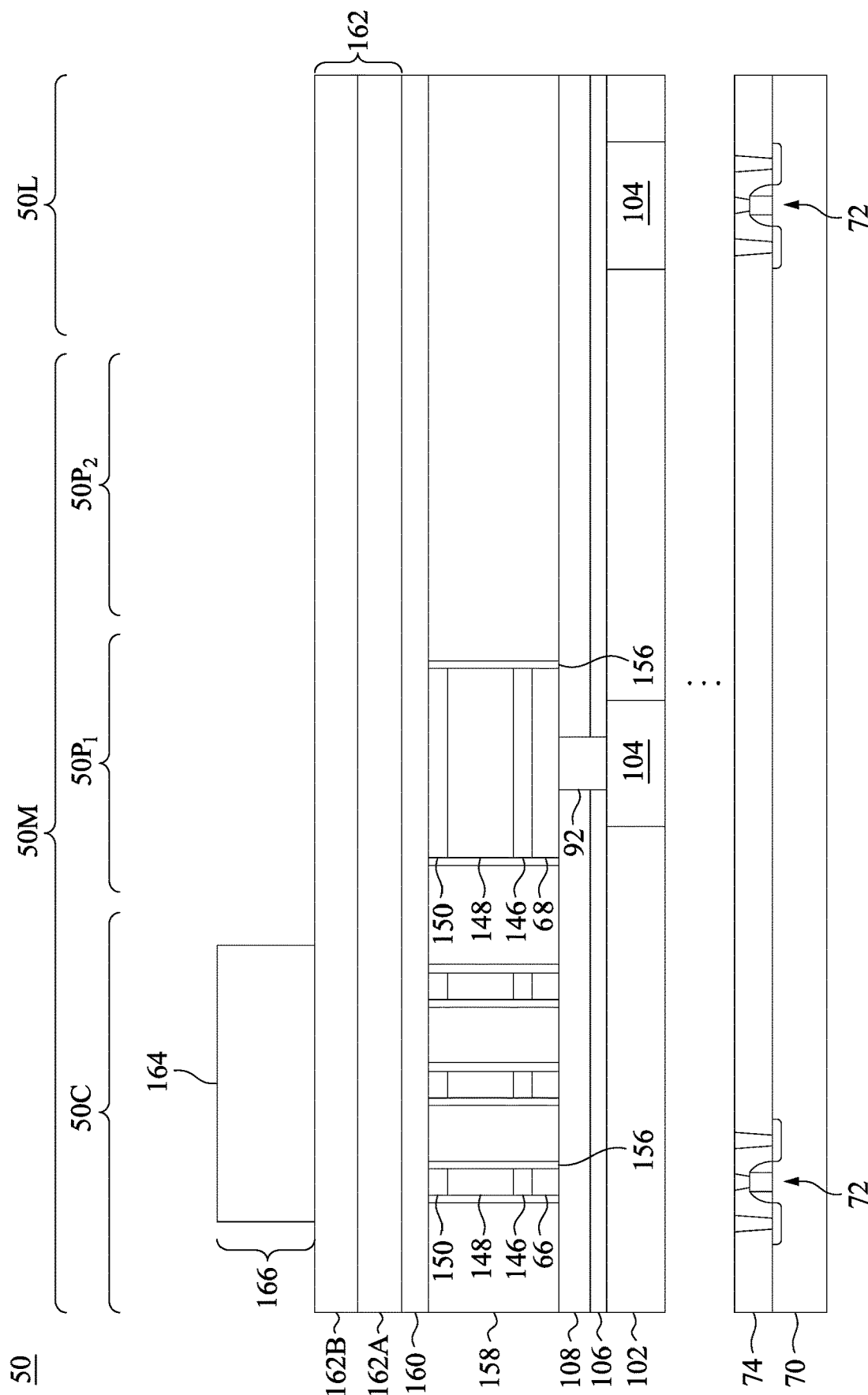

In FIG. 16, a plurality of masking layers are formed over the word line layer 160. Specifically, one or more dielectric layers(s) 162 are deposited. The dielectric layers(s) 162 will be patterned to form etching masks, which will be used in subsequent processing to pattern the word line layer 160.

The dielectric layers(s) 162 are formed on the word line layer 160. In the illustrated embodiment, the dielectric layers(s) 162 include a first dielectric layer 162A over the word line layer 160 and a second dielectric layer 162B over the first dielectric layer 162A. The first dielectric layer 162A may be a mask layer, such as a hard mask layer; may be formed of a nitride such as silicon nitride, silicon oxynitride, titanium nitride, or the like; and may be formed by deposition such as by PECVD, ALD, or the like. The second dielectric layer 162B may be a pad layer; may be formed of an oxide such as silicon oxide, a TEOS oxide, or the like; and may be formed by deposition such as by PECVD, ALD, or the like.

Spacers 164 are then formed over the dielectric layer(s) 162. The spacers 164 may be formed of a material that is selected from the same group of candidate materials of the spacers 134, and may be formed using a method that is selected from the same group of candidate methods for forming the spacers 134. For example, the spacers 164 can be formed by depositing a mandrel layer (see, e.g., FIG. 6), patterning the mandrel layer to form mandrels (see, e.g., FIG. 7), depositing a spacer layer over the mandrels (see, e.g., FIG. 8), patterning the spacer layer to form the spacers 164 (see, e.g., FIG. 9), and removing spacers 164 in undesired locations in a cut process (see, e.g., FIG. 10). The spacers 134 and the spacers 164 may be formed from the same material, or may include different materials. The remaining spacers 164 form a third mask 166 in the cell region 50C, which will be used to pattern the word line layer 160.

In FIG. 17A, a fourth mask 168 is formed in the second pad region $50P_2$. The fourth mask 168 may be photosensitive mask, such as a photoresist, such as a single-layer photoresist, a bilayer photoresist, a trilayer photoresist, or the like. The fourth mask 168 is not formed by patterning spacers, and as such, the features of the fourth mask 168 are larger than the features of the third mask 166. In some embodiments, the features of the third mask 166 and the fourth mask 168 have similar dimensions as the features of the first mask 136 and the second mask 138, respectively. In some embodiments, the features of the third mask 166 and the fourth mask 168 have different dimensions than the features of the first mask 136 and the second mask 138.

As shown by FIG. 17B, portions of the third mask 166 and portions of the fourth mask 168 overlap. Thus, some of the patterned features will be continuous with one another. Further, as will be discussed in greater detail below, the word lines 62 extend along the same direction $D_2$ (see FIG. 18B). The spacers 164, which will be used to pattern the word lines 62, thus also extend along the same direction $D_2$.

In FIG. 18A, the masks 166, 168 are used as a combined etching mask to etch and pattern the dielectric layer(s) 162. At least one of the dielectric layer(s) 162, e.g., the first dielectric layer 162A, remains after the etching and forms a patterned hard mask. The patterned hard mask is then used as an etching mask to etch and pattern the word line layer 160, the top electrode strips 150, the PCM strips 148, and the bottom electrode strips 146. The patterning may include one or more etching processes, and can form recesses 170 in the IMD layer 158. The etching method may include a plasma etching method, such as ion beam etching (IBE). IBE offers a high level of precision (e.g., high anisotropism), which can help control the profile of the resulting word lines 62. The etching may be implemented using glow discharge plasma (GDP), capacitive coupled plasma (CCP), inductively coupled plasma (ICP), or the like. The third mask 166, the fourth mask 168, and/or the dielectric layer(s) 162 may be consumed in the etching process, or may be removed after the etching process. In the illustrated embodiment, the first dielectric layer 162A remains after the etching process.

The etching process forms word lines 62 and word line pads 64. The word lines 62 are disposed over top electrodes 86 and the word line pads 64 are disposed over unpatterned portions of the IMD layer 158. The word lines 62 and the word line pads 64 comprise remaining portions of the word line layer 160. Although not shown, it should be appreciated that the word lines 62 can have sloped sidewalls, and can have trapezoidal shapes in the illustrated cross-section. The patterned word line layer 160 has the same shape in the top-down view as the combined shape of the masks 166, 168 (see FIG. 17B).

As shown by FIG. 18B, each of the word lines 62 are metal strips that extend along the same direction $D_2$ and emanate from a word line pad 64. Thus, although the word lines 62 and the word line pads 64 are illustrated as separate elements, it should be appreciated that each word line pad 64 and its corresponding word lines 62 are actually a single continuous conductive feature that is patterned from the word line layer 160. In other words, the patterning shown in FIG. 18A forms second conductive features that have word line portions and word line pad portions.

The etching process also patterns the top electrode strips 150, the PCM strips 148, and the bottom electrode strips 146 to form the bottom electrodes 82, the PCM elements 84, and the top electrodes 86, respectively, which together form the PCRAM cells 58. Each PCRAM cell 58 includes a bottom electrode 82, a PCM element 84, and a top electrode 86, with the PCM element 84 being disposed between the bottom electrode 82 and the top electrode 86. The bottom electrodes 82 comprise remaining portions of the bottom electrode strips 146. The PCM elements 84 comprise remaining portions of the PCM strips 148. The top electrodes 86 comprise remaining portions of the top electrode strips 150. Although not shown, it should be appreciated that the bottom electrodes 82, the PCM elements 84, and the top electrodes 86 can have sloped sidewalls, and can have trapezoidal shapes in the illustrated cross-section.

The etching process removes the portions of the top electrode strips 150, the PCM strips 148, and the bottom electrode strips 146 that are uncovered by the masks 166, 168, such as the portions of those layers over the bit line pads 68. Thus, as shown by FIG. 18B, each PCRAM cell 58 is disposed at an intersection of a word line 62 and a bit line 66 in the top-down view. The PCRAM cells 58 are thus formed in a self-aligned manner, which allows the spacing distance $D_5$ and the width $W_4$ of the PCRAM cells 58 to be small. For example, the spacing distance $D_5$ can be in the range of about 20 nm to about 50 nm, and the width $W_4$ can be in the range of about 15 nm to about 30 nm. The spacing distance $D_5$ corresponds to both the distance between adjacent PCRAM cells 58, and also the distance between adjacent intersections of the word lines 62 and the bit lines 66.

The recesses 170 are formed in portions of the IMD layer 158. Specifically, the recesses 170 are formed by etching the IMD layer 158 and any top electrode strips 150, PCM strips 148, or bottom electrode strips 146 that are uncovered by the masks 166, 168. Thus, the recesses 170 expose the bit line pads 68. Timed etch processes may be used to stop the etching of the recesses 170 after the recesses 170 reach a desired depth. Although not shown in FIG. 18A, it should be appreciated that the recesses 170 also expose portions of the bit lines 66 that are not disposed beneath the word lines 62 and the word line pads 64. The recesses 170 can be formed by performing the etching process (described above) with multiple etches. For example, the etching process can include a first etch and a second etch. The first etch can selectively etch the material of the word line layer 160 at a faster rate than the materials of the IMD layer 158, the top electrode strips 150, the PCM strips 148, and the bottom electrode strips 146. The second etch can selectively etch the materials of the IMD layer 158, the top electrode strips 150, the PCM strips 148, and the bottom electrode strips 146 at a faster rate than the material of the bit lines 66 and the bit line pad 68. In some embodiments, the first etch is ion beam etching using sulfur hexafluoride ($SF_6$), argon (Ar), oxygen ($O_2$), and difluoromethane ($CH_2F_2$) for a duration in a range of 20 seconds to 60 seconds, and the second etch is ion beam etching using chlorine ($Cl_2$), hydrogen bromide (HBr), argon (Ar), and difluoromethane ($CH_2F_2$) for a duration in a range of 15 seconds to 75 seconds. Other etching parameters may be used when manufacturing magnetoresistive random-access memories (MRAMs), resistive random access memories (RRAMs), memories with a selector structure, or the like. Further, the etching parameters can be varied based on the materials of the etched films and the film thicknesses.

After the recesses 170 are formed, the IMD layer 158 includes recessed portions 158R and unrecessed portions 158U. The recessed portions 158R surround bit lines 66 and the bit line pads 68, and the unrecessed portions 158U surround the PCRAM cells 58. The recessed portions 158R are disposed beneath the word lines 62 and the word line pads 64. The recessed portions 158R are unpatterned and thus have a greater height than the unrecessed portions 158U.

It should be appreciated that FIGS. 16 through 18B illustrate an example process for patterning the word line layer 160, and other processes may be used to pattern the word line layer 160. For example, the word line layer 160 may also be patterned using next-generation lithography techniques such as extreme ultraviolet (EUV) lithography, deep ultraviolet (DUV) lithography, X-ray lithography, soft X-ray (SX) lithography, ion beam projection lithography, electron-beam projection lithography, or the like. The use of next-generation lithography techniques may allow the word line layer 160 to be patterned by a single-patterning photolithography process, obviating the need for multiple-patterning photolithography processes.

Figure 19:
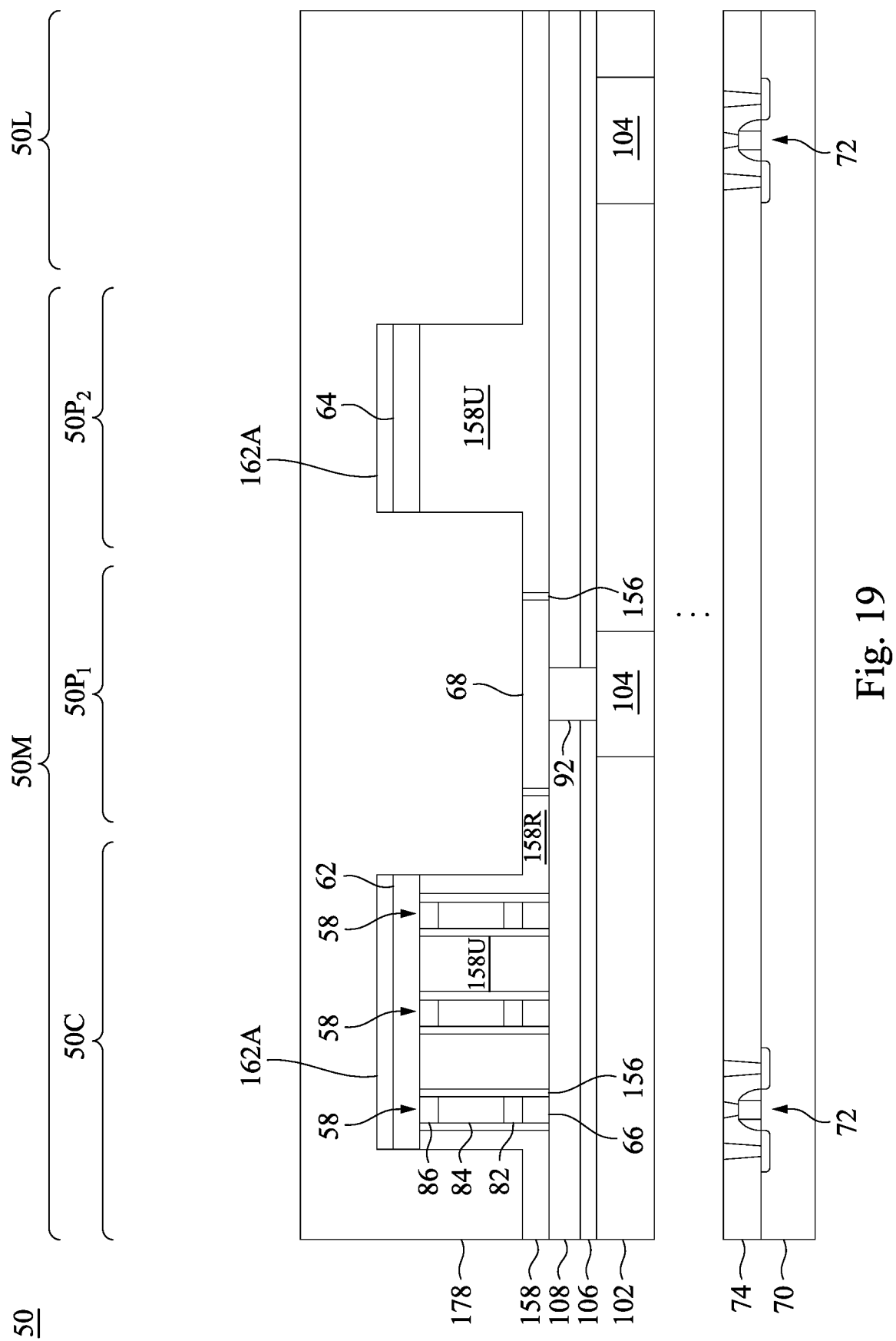

In FIG. 19, an IMD layer 178 is formed over the IMD layer 158, the bit line pads 68, and the first dielectric layer 162A (if present) or the word lines 62 and the word line pads 64. The IMD layer 178 may be formed of a material that is selected from the same group of candidate materials of the IMD layer 108, and may be formed using a method that is selected from the same group of candidate methods for forming the IMD layer 108. The IMD layer 108 and the IMD layer 178 may be formed from the same material, or may include different materials. After formation, the IMD layer 178 is disposed over the bit lines 66 and the recessed portions 158R of the IMD layer 158. The IMD layer 178 thus surrounds the word lines 62, the word line pads 64, and the unrecessed portions 158U of the IMD layer 158. Further, the combination of the IMD layers 158, 178 surround the PCRAM cells 58 on all four sides. Confining all four sides of the PCRAM cells 58 in a dielectric material can improve the performance of the PCRAM cells 58 during operation, as the dielectric material helps absorb heat that is generated when the PCM elements 84 change phases.

Figure 20:
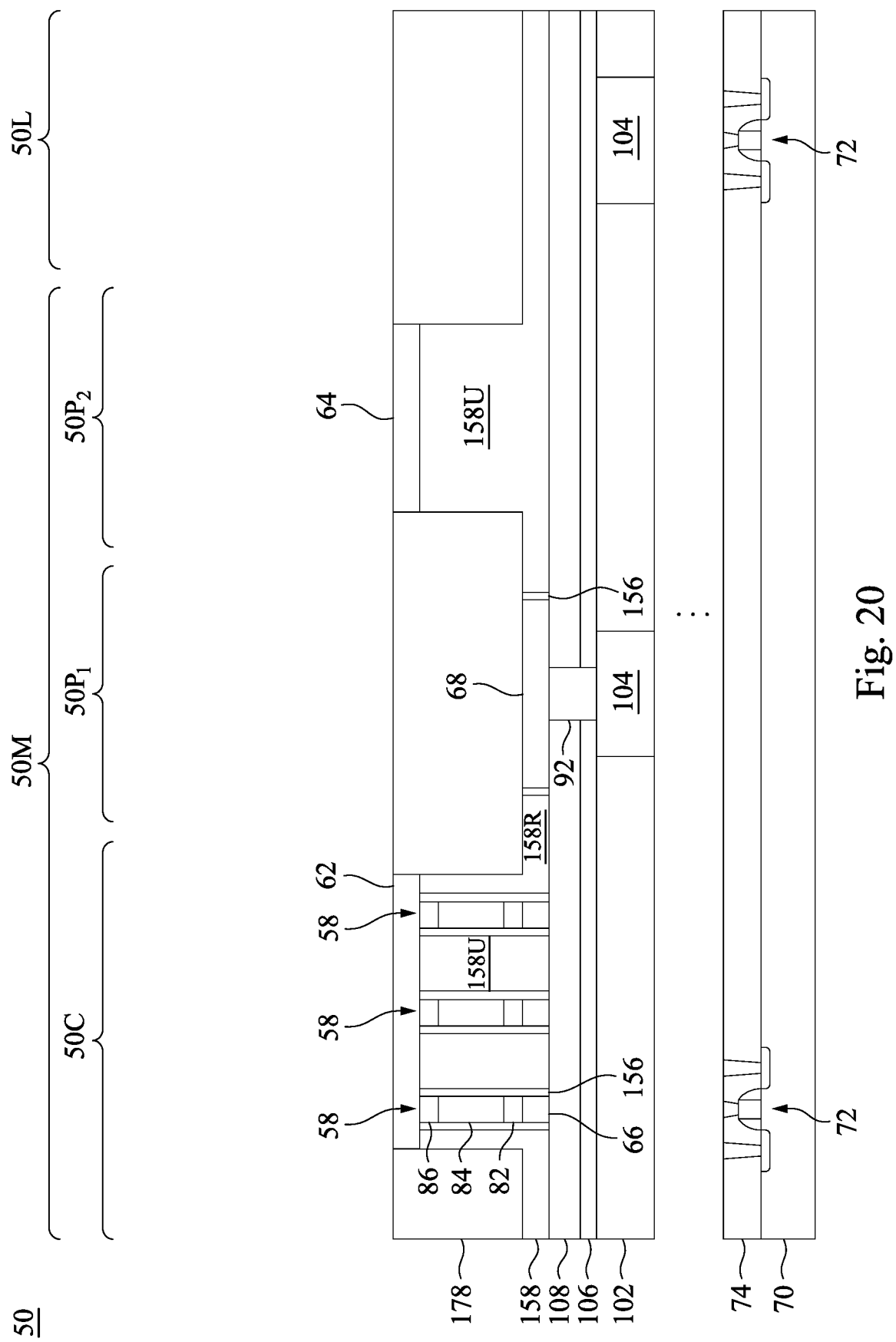

In FIG. 20, a planarization process is performed to remove excess material of the IMD layer 178. The planarization process can be a CMP, mechanical grinding, an etchback, or the like. The planarization process removes the first dielectric layer 162A (if present) to expose the word lines 62 and the word line pads 64. After the planarization process, top surfaces of the IMD layer 178, the word line pads 64, and the word lines 62 are coplanar (within process variations).

In FIG. 21A, an etch stop layer 182 is formed on the planarized top surfaces of the IMD layer 178, the word line pads 64, and the word lines 62. The etch stop layer 182 may be formed of a material that is selected from the same group of candidate materials of the etch stop layer 106, and may be formed using a method that is selected from the same group of candidate methods for forming the etch stop layer 106. The etch stop layer 106 and the etch stop layer 182 may be formed from the same material, or may include different materials.

An IMD layer 184 is then formed on the etch stop layer 182. The IMD layer 184 may be formed of a material that is selected from the same group of candidate materials of the IMD layer 108, and may be formed using a method that is selected from the same group of candidate methods for forming the IMD layer 108. The IMD layer 108 and the IMD layer 184 may be formed from the same material, or may include different materials.

Conductive features 186 (e.g., interconnects) are then formed extending through the IMD layer 184 and the etch stop layer 182. The conductive features 186 include conductive vias 186V (which can correspond to the metal vias V5, see FIG. 2, and to the conductive vias 94, see FIG. 1) and conductive lines 186L (which can correspond to the metal lines L5, see FIG. 2). The conductive features 186 are formed in both the memory region 50M and the logic region 50L. The conductive features 186 may be formed by a damascene process, such as a single damascene process, a dual damascene process, or the like. The conductive features 186 are electrically coupled to the memory devices (e.g., PCRAMs) formed in the memory region 50M and the logic devices (e.g., logic circuits) formed in the logic region 50L.

A first subset of the conductive features 186A are formed in the memory region 50M, and are connected to the word line pads 64. A second subset of the conductive features 186B are formed in the logic region 50L, and further extend though the IMD layer 178, the IMD layer 158, the IMD layer 108, and the etch stop layer 106 to be connected to the conductive features 104. In some embodiments, the conductive features 186 electrically couple the memory devices to the logic devices. For example, the conductive features 186 can be used to electrically couple some of the conductive features 104 to some of the word line pads 64, such as in the illustrated metallization layer, or in another metallization layer. Although each conductive via 186V and corresponding conductive line 186L is illustrated as a separate element, it should be appreciated that they may be a continuous conductive feature, such as in embodiments where they are formed by a dual damascene process.

Each PCRAM cell 58 is connected to a conductive feature 186 and a conductive feature 104. Specifically, each top electrode 86 is connected to a conductive line 186L by a word line 62, a word line pad 64, and a conductive via 94. Likewise, each bottom electrode 82 is connected to a conductive feature 104 by a bit line 66, a bit line pad 68, and a conductive via 92. The word line pads 64 are disposed under and are physically and electrically coupled to the conductive vias 94. The bit line pads 68 are disposed over and are physically and electrically coupled to the conductive vias 92. Thus, the conductive vias 92 connect the bit line pads 68 to conductive features (e.g., interconnects) of an underlying metallization pattern (e.g., metallization layer M4 in FIG. 2), and the conductive vias 94 connect the word line pads 64 to conductive features (e.g., interconnects) of an overlying metallization pattern (e.g., metallization layer M6 in FIG. 2). Further, the conductive features 186B connect the conductive features of the underlying metallization pattern to the conductive features of the overlying metallization pattern.

As shown by FIG. 21B, the bit lines 66 emanating from each bit line pad 68 can be interleaved. For example, the bit lines 66 emanating from a first bit line pad 68A can be interleaved with the bit lines 66 emanating from a second bit line pad 68B. Similarly, the word lines 62 emanating from each word line pad 64 can be interleaved. For example, the word lines 62 emanating from a first word line pad 64A can be interleaved with the word lines 62 emanating from a second word line pad 64B.

Figure 22:
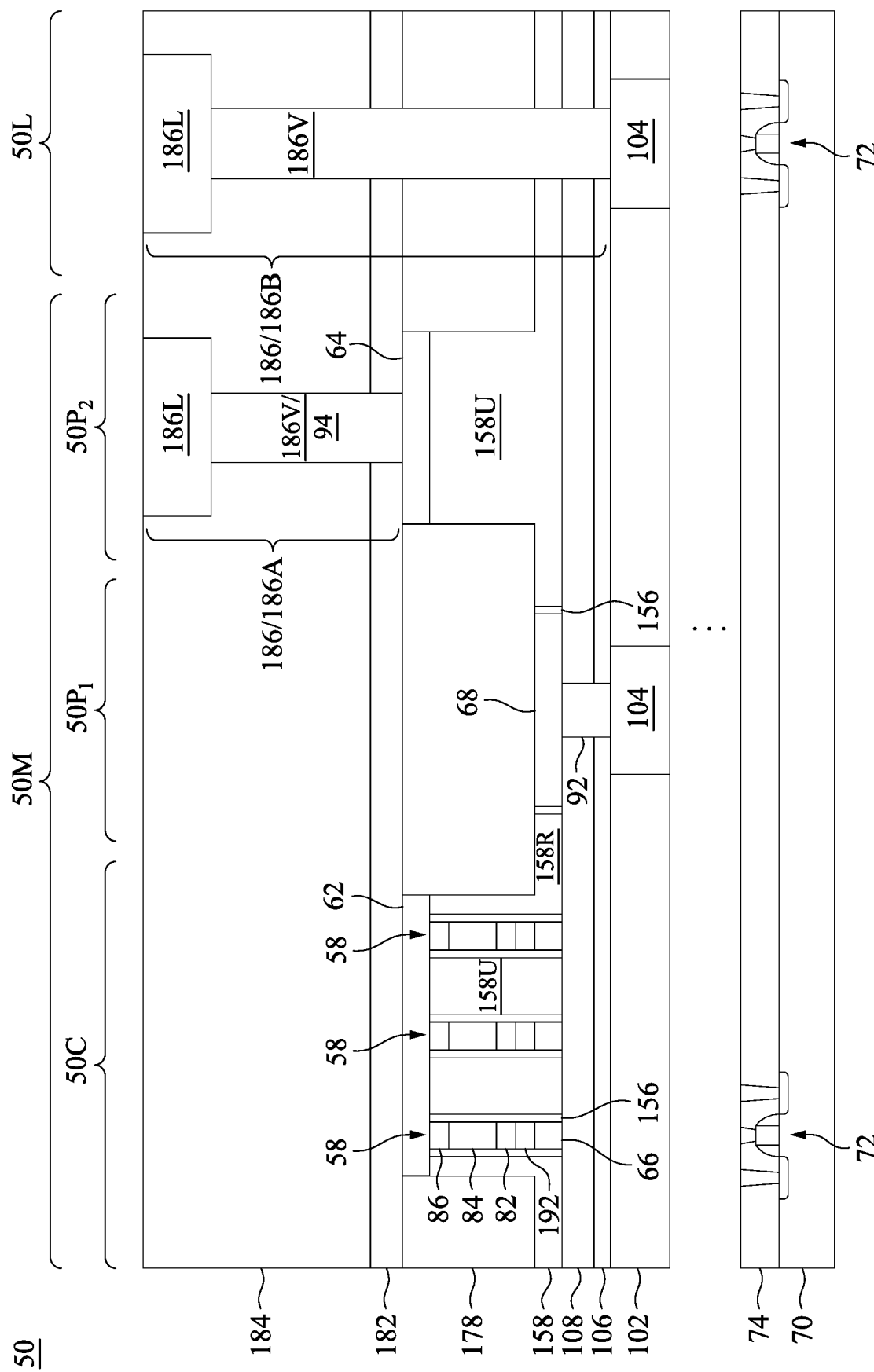
FIG. 22 is a cross-sectional view of a semiconductor device, in accordance with some other embodiments.

FIG. 22 is a cross-sectional view of the semiconductor device 50, in accordance with some other embodiments. This embodiment is similar to the embodiment described with respect to FIG. 21A, except ovonic threshold switching (OTS) layers 192 are formed between the bottom electrodes 82 and the bit lines 66. The OTS layers 192 may be formed of a chalcogenide material, and can be formed of a different chalcogenide material than the PCM elements 84. The OTS layers 192 may be used for memory selectors. Memory selectors function similar to transistors, having a threshold voltage ($V_{th}$) value. Only applied voltages larger than the $V_{th}$ of a PCRAM cell 58 can create a current path to the PCRAM cell 58, thus enabling memory read/write operations.

FIGS. 23A through 23E are three-dimensional views of intermediate stages in a self-aligned patterning process for forming the PCRAM cells, in accordance with some embodiments. FIGS. 23A through 23E are simplified views, and some features are omitted for clarity of illustration. FIGS. 23A through 23E illustrate additional views of the semiconductor device 50 during the process described above with respect to FIGS. 3 through 21B.

Figure 23A:
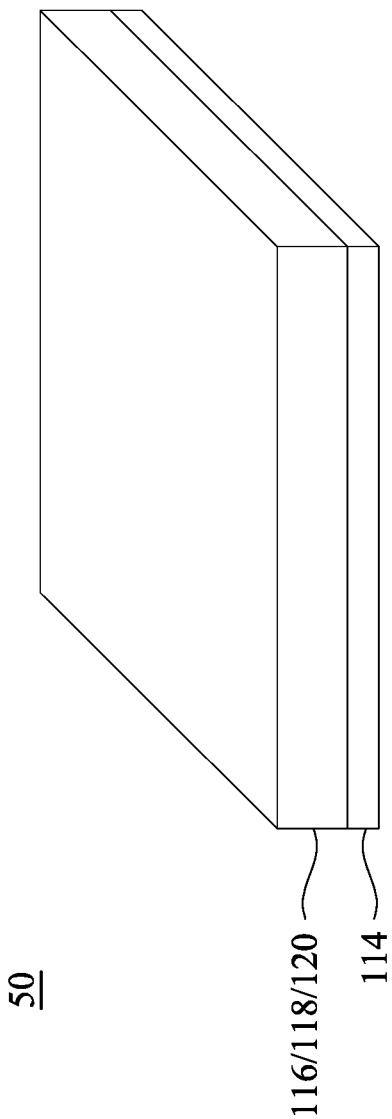
FIGS. 23A through 23E are three-dimensional views of intermediate stages in a self-aligned patterning process for forming PCRAM cells, in accordance with some embodiments.

In FIG. 23A, the bit line layer 114 is deposited over a substrate, and the memory cell layers (e.g., the bottom electrode layer 116, the PCM layer 118, and the top electrode layer 120) are deposited over the bit line layer 114. The bit line layer 114 and the memory cell layers are deposited in the manner described with respect to FIG. 5.

Figure 23B:
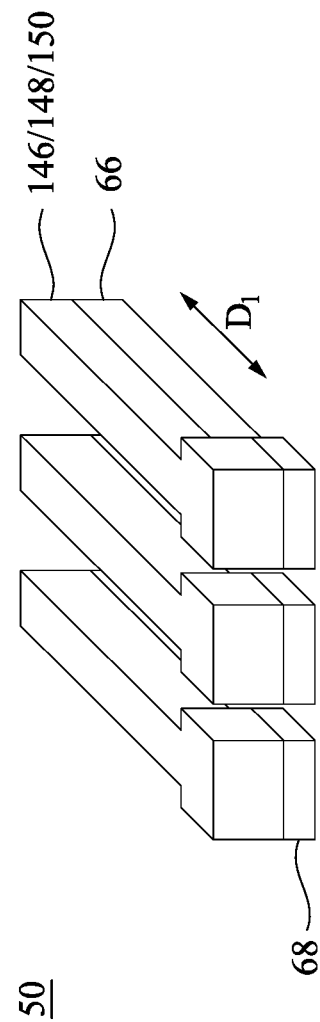

In FIG. 23B, the bottom electrode layer 116, the PCM layer 118, the top electrode layer 120, and the bit line layer 114 are patterned. Patterning the bit line layer 114 forms the bit lines 66 and the bit line pads 68. Patterning the bottom electrode layer 116, the PCM layer 118, and the top electrode layer 120 forms the bottom electrode strips 146, the PCM strips 148, and the top electrode strips 150, respectively. The bottom electrode strips 146, the PCM strips 148, the top electrode strips 150, and the bit lines 66 each extend in the first direction $D_1$. The bottom electrode layer 116, the PCM layer 118, the top electrode layer 120, and the bit line layer 114 are patterned in the manner described with respect to FIGS. 6 through 12B.

Figure 23C:
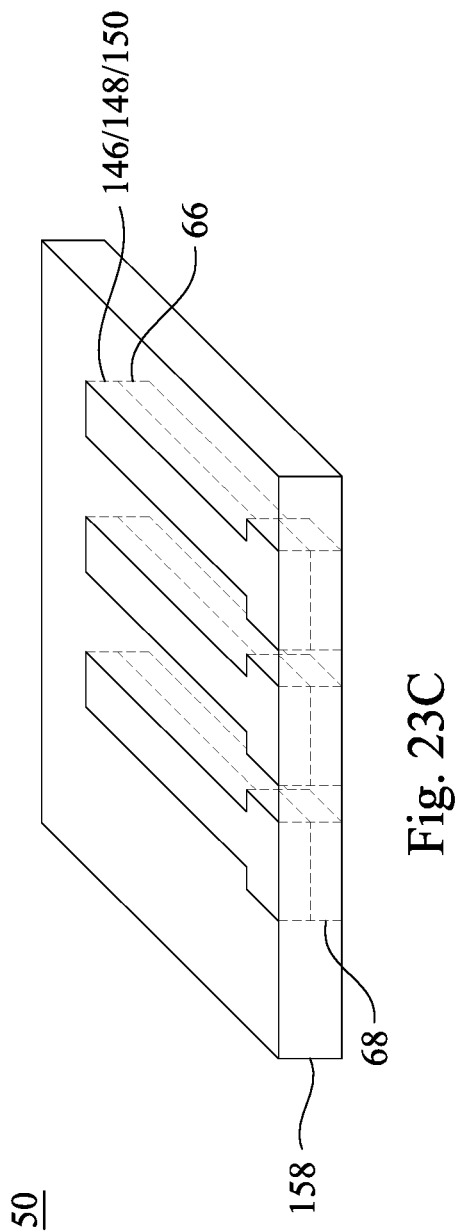

In FIG. 23C, the IMD layer 158 is deposited around the bottom electrode strips 146, the PCM strips 148, the top electrode strips 150, the bit lines 66, and the bit line pads 68. The IMD layer 158 is then planarized to expose the top electrode strips 150. The IMD layer 158 is deposited and planarized in the manner described with respect to FIGS. 13 and 14.

Figure 23D:
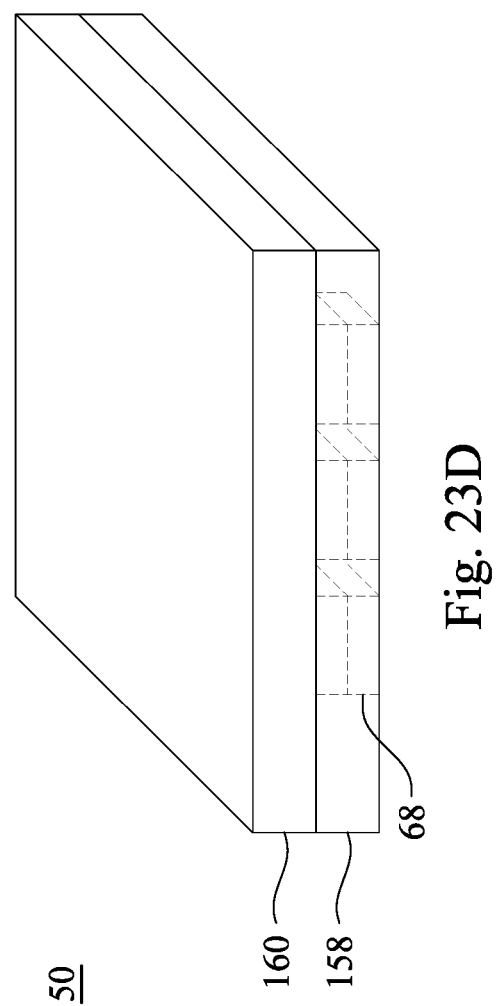

In FIG. 23D, the word line layer 160 is deposited over the IMD layer 158, the top electrode strips 150, and the other underlying strips. The word line layer 160 is deposited in the manner described with respect to FIG. 15.

Figure 23E:
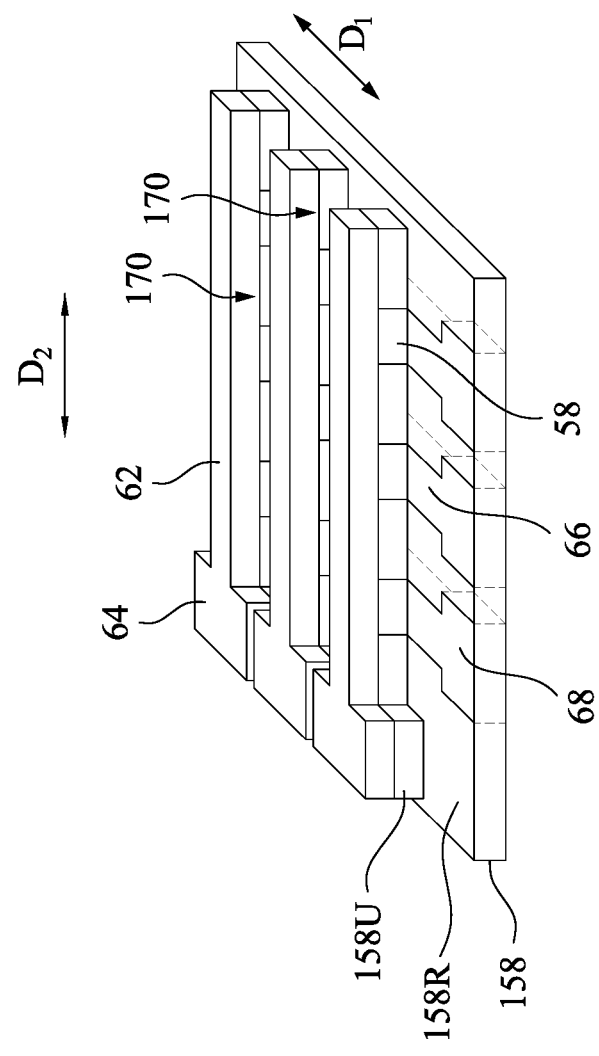

In FIG. 23E, the word line layer 160, the bottom electrode strips 146, the PCM strips 148, and the top electrode strips 150 are patterned. Patterning the word line layer 160 forms the word lines 62 and the word line pads 64. Patterning the bottom electrode strips 146, the PCM strips 148, and the top electrode strips 150 forms the PCRAM cells 58. The word lines 62 each extend in the second direction $D_2$, which is perpendicular to the first direction $D_1$. As noted above, the PCRAM cells 58 are each disposed at an intersection of a word line 62 and a bit line 66 in a top-down view. The word line layer 160, the bottom electrode strips 146, the PCM strips 148, and the top electrode strips 150 are patterned in the manner described with respect to FIGS. 16 through 18B.

Embodiments may achieve advantages. Forming the PCRAM cells 58 in a self-aligned manner with multiple patterning processes allows the PCRAM cells 58 to be formed with smaller spacing distances and widths, thereby improving the density and the performance of the PCRAM cells 58. Specifically, smaller PCRAM cells 58 generate less heat when their PCM elements 84 change phases. Further, embodiments patterning processes allow the word lines 62 and the bit lines 66 for the PCRAM array to be simultaneously patterned with the PCRAM cells 58, allowing manufacturing costs to be reduced.

In an embodiment, a device includes: a first metallization layer over a substrate, the substrate including active devices; a first bit line over the first metallization layer, the first bit line connected to first interconnects of the first metallization layer, the first bit line extending in a first direction, the first direction parallel to gates of the active devices; a first phase-change random access memory (PCRAM) cell over the first bit line; a word line over the first PCRAM cell, the word line extending in a second direction, the second direction perpendicular to the gates of the active devices; and a second metallization layer over the word line, the word line connected to second interconnects of the second metallization layer.

In some embodiments, the device further includes: a second bit line over the first metallization layer, the second bit line extending in the first direction; and a second PCRAM cell over the second bit line, the word line disposed over the second PCRAM cell, the first PCRAM cell being separated from the second PCRAM cell by a distance in a range of 20 nm to 50 nm. In some embodiments of the device, the first PCRAM cell and the second PCRAM cell each have a width in a range of 15 nm to 30 nm. In some embodiments, the device further includes: a bit line pad over the first metallization layer, the bit line pad and the first bit line being a first continuous conductive feature; a first conductive via connecting the bit line pad to the first interconnects of the first metallization layer; and a first inter-metal dielectric (IMD) layer around the first conductive via, the first continuous conductive feature disposed on the first IMD layer. In some embodiments, the device further includes: a word line pad over the bit line pad, the word line pad and the word line being a second continuous conductive feature; a second conductive via connecting the word line pad to the second interconnects of the second metallization layer; and a second IMD layer around the second conductive via, the second IMD layer disposed on the second continuous conductive feature. In some embodiments, the device further includes: a third conductive via extending through the first IMD layer and the second IMD layer, the third conductive via connecting the first interconnects of the first metallization layer to the second interconnects of the second metallization layer. In some embodiments, the device further includes: a first dielectric layer having a first portion and a second portion, the first portion surrounding the first bit line, the second portion surrounding the first PCRAM cell, the first portion having a first height, the second portion having a second height, the second height being greater than the first height, the word line disposed over the second portion. In some embodiments, the device further includes: a second dielectric layer over the first bit line and the first portion of the first dielectric layer, the second dielectric layer surrounding the word line and the second portion of the first dielectric layer. In some embodiments of the device, the first PCRAM cell includes: a bottom electrode connected to the first bit line; a top electrode connected to the word line; and a phase change material (PCM) element between the top electrode and the bottom electrode. In some embodiments, the device further includes: an ovonic threshold switching layer between the bottom electrode and the first bit line.

In an embodiment, a device includes: a first inter-metal dielectric (IMD) layer; a first conductive via extending through the first IMD layer; a first conductive feature having a bit line pad portion and a bit line portion, the bit line pad portion disposed on the first conductive via, the bit line portion disposed on the first IMD layer; a phase-change random access memory (PCRAM) cell on the bit line portion of the first conductive feature; a second IMD layer surrounding the PCRAM cell and the first conductive feature; and a second conductive feature having a word line pad portion and a word line portion, the word line pad portion disposed on the second IMD layer, the word line portion disposed on the PCRAM cell.

In some embodiments, the device further includes: a second conductive via on the word line pad portion of the second conductive feature; and a third IMD layer surrounding the second conductive via.

In an embodiment, a method includes: forming a bit line layer over a substrate including active devices; depositing a phase change material (PCM) layer over the bit line layer; patterning the PCM layer and the bit line layer to form a PCM strip and a bit line, respectively, the PCM strip and the bit line each extending in a first direction in a top-down view, the first direction parallel to gates of the active devices; depositing a first inter-metal dielectric (IMD) layer around the PCM strip and the bit line; depositing a word line layer over the first IMD layer and the PCM strip; and patterning the word line layer and the PCM strip to form a word line and a PCM element, respectively, the word line extending in a second direction in the top-down view, the second direction perpendicular to the gates of the active devices, the PCM element disposed at an intersection of the word line and the bit line in the top-down view.

In some embodiments of the method, patterning the PCM layer and the bit line layer includes: forming a first mask over the PCM layer, features of the first mask extending in the first direction, the features of the first mask having a first width; forming a second mask over the PCM layer, features of the second mask extending in the second direction, the features of the second mask having a second width, portions of the first mask and the second mask overlapping; and etching the PCM layer and the bit line layer using the first mask and the second mask as a first combined etching mask to form a first conductive feature, the first conductive feature including the bit line and a bit line pad. In some embodiments of the method, patterning the word line layer and the PCM strip includes: forming a third mask over the word line layer, features of the third mask having the first width; forming a fourth mask over the PCM layer, features of the fourth mask having the second width, portions of the third mask and the fourth mask overlapping; and etching the word line layer and the PCM strip using the third mask and the fourth mask as a second combined etching mask to form a second conductive feature, the second conductive feature including the word line and a word line pad. In some embodiments of the method, etching the word line layer and the PCM strip includes: etching the word line layer with ion beam etching using hexafluoride ($SF_6$), argon (Ar), oxygen ($O_2$), and difluoromethane ($CH_2F_2$) for a duration in a range of 20 seconds to 60 seconds; and etching the PCM strip and the first IMD layer with ion beam etching using chlorine ($Cl_2$), hydrogen bromide (HBr), argon (Ar), and difluoromethane ($CH_2F_2$) for a duration in a range of 15 seconds to 75 seconds. In some embodiments, the method further includes: depositing the bit line layer on a first conductive via, the bit line pad contacting the first conductive via; and forming a second conductive via contacting the word line pad. In some embodiments of the method, patterning the word line layer and the PCM strip includes exposing a portion of the bit line layer covered by the PCM strip. In some embodiments of the method, patterning the word line layer and the PCM strip includes recessing a portion of the first IMD layer, the word line disposed on an unrecessed portion of the first IMD layer. In some embodiments, the method further includes: depositing a second IMD layer around the word line and the unrecessed portion of the first IMD layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a first metallization layer over a substrate, the substrate comprising active devices;
   a first bit line over the first metallization layer, the first bit line connected to first interconnects of the first metallization layer, the first bit line extending in a first direction, the first direction parallel to gates of the active devices;
   a first phase-change random access memory cell over the first bit line;
   a first dielectric layer having a first portion and a second portion, the first portion surrounding the first bit line, the second portion surrounding the first phase-change random access memory cell, the first portion having a first height, the second portion having a second height, the second height being greater than the first height;
   a word line over the first phase-change random access memory cell and the second portion of the first dielectric layer, the word line extending in a second direction, the second direction perpendicular to the gates of the active devices; and
   a second metallization layer over the word line, the word line connected to second interconnects of the second metallization layer.

2. The device of claim 1 further comprising:
   a second bit line over the first metallization layer, the second bit line extending in the first direction; and
   a second phase-change random access memory cell over the second bit line, the word line disposed over the second phase-change random access memory cell, the first phase-change random access memory cell being separated from the second phase-change random access memory cell by a distance in a range of 20 nm to 50 nm.

3. The device of claim 2, wherein the first phase-change random access memory cell and the second phase-change random access memory cell each have a width in a range of 15 nm to 30 nm.

4. The device of claim 1 further comprising:
   a bit line pad over the first metallization layer, the bit line pad and the first bit line being a first continuous conductive feature;
   a first conductive via connecting the bit line pad to the first interconnects of the first metallization layer; and
   a first inter-metal dielectric around the first conductive via, the first continuous conductive feature disposed over the first inter-metal dielectric.

5. The device of claim 4 further comprising:
   a word line pad over the bit line pad, the word line pad and the word line being a second continuous conductive feature;
   a second conductive via connecting the word line pad to the second interconnects of the second metallization layer; and
   a second inter-metal dielectric around the second conductive via, the second inter-metal dielectric disposed over the second continuous conductive feature.

6. The device of claim 5 further comprising:
   a third conductive via extending through the first inter-metal dielectric and the second inter-metal dielectric, the third conductive via connecting the first interconnects of the first metallization layer to the second interconnects of the second metallization layer.

7. The device of claim 1 further comprising:
a second dielectric layer over the first bit line and the first portion of the first dielectric layer, the second dielectric layer surrounding the word line and the second portion of the first dielectric layer.

8. The device of claim 1, wherein the first phase-change random access memory cell comprises:
a bottom electrode connected to the first bit line;
a top electrode connected to the word line; and
a phase change material element between the top electrode and the bottom electrode.

9. The device of claim 8 further comprising:
an ovonic threshold switching layer between the bottom electrode and the first bit line.

10. A device comprising:
a first inter-metal dielectric;
a first conductive via extending through the first inter-metal dielectric;
a first conductive feature having a bit line pad portion and a bit line portion, the bit line pad portion disposed on the first conductive via, the bit line portion disposed on the first inter-metal dielectric;
a phase-change random access memory cell on the bit line portion of the first conductive feature;
a second inter-metal dielectric surrounding the phase-change random access memory cell and the first conductive feature; and
a second conductive feature having a word line pad portion and a word line portion, the word line pad portion disposed on the second inter-metal dielectric, the word line portion disposed on the phase-change random access memory cell.

11. The device of claim 10 further comprising:
a second conductive via on the word line pad portion of the second conductive feature; and
a third inter-metal dielectric surrounding the second conductive via.

12. The device of claim 10, wherein the second inter-metal dielectric has a first portion and a second portion, the first portion surrounding the bit line pad portion, the second portion surrounding the phase-change random access memory cell and the bit line portion, the first portion having a first height, the second portion having a second height, the second height being greater than the first height, the device further comprising:
a third inter-metal dielectric over the first portion of the second inter-metal dielectric, the third inter-metal dielectric surrounding the second portion of the second inter-metal dielectric.

13. The device of claim 10 further comprising:
an ovonic threshold switching layer between the phase-change random access memory cell and the bit line portion.

14. A device comprising:
a first inter-metal dielectric over a semiconductor substrate;
a first conductive feature on the first inter-metal dielectric, the first conductive feature having a bit line pad portion and a bit line portion, the bit line portion extending in a first direction in a top-down view;
a memory cell on the bit line portion;
a second inter-metal dielectric around the memory cell and the first conductive feature; and
a second conductive feature on the second inter-metal dielectric, the second conductive feature having a word line pad portion and a word line portion, the word line portion extending in a second direction in the top-down view, the second direction perpendicular to the first direction, the memory cell disposed at an intersection of the word line portion and the bit line portion in the top-down view.

15. The device of claim 14 further comprising:
a third inter-metal dielectric around the second conductive feature.

16. The device of claim 14 further comprising:
a first conductive via extending through the first inter-metal dielectric, the bit line pad portion disposed on the first conductive via.

17. The device of claim 16 further comprising:
a third inter-metal dielectric over the second conductive feature; and
a second conductive via extending through the third inter-metal dielectric, the second conductive via disposed on the word line pad portion.

18. The device of claim 14, wherein the memory cell is a phase-change random access memory cell.

19. The device of claim 14, wherein the second inter-metal dielectric has a first portion adjacent the memory cell and has a second portion adjacent the bit line pad portion, the first portion having a first height, the second portion having a second height, the second height being different than the first height.

20. The device of claim 14 further comprising:
an ovonic threshold switching layer between the memory cell and the bit line portion.

* * * * *